US012795944B2

(12) United States Patent
Cheng et al.

(10) Patent No.: US 12,795,944 B2
(45) Date of Patent: Nov. 10, 2026

(54) SEMICONDUCTOR STRUCTURE AND METHOD OF MANUFACTURING SEMICONDUCTOR STRUCTURE

(71) Applicant: Taiwan Semiconductor Manufacturing Company, Ltd., Hsinchu (TW)

(72) Inventors: Chun-Ren Cheng, Hsin-Chu City (TW); Ching-Hui Lin, Taichung City (TW); Fu-Chun Huang, Zhubei City (TW); Chao-Hung Chu, Keelung City (TW); Po-Chen Yeh, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 933 days.

(21) Appl. No.: 17/834,274

(22) Filed: Jun. 7, 2022

(65) Prior Publication Data

US 2023/0240079 A1 Jul. 27, 2023

Related U.S. Application Data

(60) Provisional application No. 63/303,818, filed on Jan. 27, 2022.

(51) Int. Cl.
*H10B 53/40* (2023.01)
*H10B 53/30* (2023.01)
*H10W 20/20* (2026.01)

(52) U.S. Cl.
CPC ............ *H10B 53/40* (2023.02); *H10B 53/30* (2023.02); *H10W 20/20* (2026.01)

(58) Field of Classification Search
CPC ........ H10B 51/10–50; H10B 53/10–50; H10B 12/30–395; H10B 12/03–0387; H10B 12/60–716; H10B 61/10–22; H10B 10/18; H10B 12/50; H10B 20/60; H10B 41/40–49; H10B 12/033; H10B 53/00–50; H10B 51/20; H01L 23/49827; H01L 23/5384; H01L 2224/08165; H01L 2224/16165; H01L 2224/16235; H01L 2224/32165; H01L 2224/32235;
(Continued)

(56) References Cited

U.S. PATENT DOCUMENTS 6,204,165 B1 * 3/2001 Ghoshal ............. H01L 21/7682 438/634
6,404,667 B1 6/2002 Yoo
(Continued)

*Primary Examiner* — Julio J Maldonado
*Assistant Examiner* — Eric Manuel Mulero Flores
(74) *Attorney, Agent, or Firm* — Eschweiler & Potashnik, LLC

(57) ABSTRACT

A semiconductor structure includes a first die, a second die, and an inter die via (IDV). The first die includes an interconnection structure and a CMOS device electrically connected to the interconnection structure. The second die includes a memory element including a first electrode, a ferroelectric layer on the first electrode, and a second electrode on the ferroelectric layer, wherein a peripheral region of the ferroelectric layer is exposed by and surrounding the second electrode from a top view perspective. The IDV electrically connects the interconnection structure of the first die to the memory element of the second die.

20 Claims, 29 Drawing Sheets

(58) Field of Classification Search

CPC . H01L 2224/40165; H01L 2224/40235; H01L 2224/48165; H01L 2224/48235; H01L 2225/06503–06596; H01L 25/0756; H01L 25/117; H01L 2221/1042–1047; H01L 25/04; H01L 25/0652–0657; H01L 25/071–074; H01L 2225/06541–06548; H01L 23/535; H01L 2221/1063; H01L 23/5226; H01L 23/528; H01L 23/49822; H10D 62/115–116; H10D 1/682–688; H10D 1/60; G11C 11/221; G11C 11/22; H10N 70/801–826; H10N 70/881

See application file for complete search history.

(56) References Cited

U.S. PATENT DOCUMENTS

| | | | | |
|---|---|---|---|---|
| 8,330,278 | B2 * | 12/2012 | Lee | H01L 24/73<br>438/109 |
| 2003/0017627 | A1 | 1/2003 | Li et al. | |
| 2004/0135185 | A1 * | 7/2004 | Yabuki | H10B 53/30<br>257/306 |
| 2004/0245558 | A1 | 12/2004 | Manger | |
| 2006/0043596 | A1 * | 3/2006 | Gotkis | H01L 21/7682<br>257/E23.161 |
| 2006/0166378 | A1 | 7/2006 | Maruyama et al. | |
| 2011/0068313 | A1 | 3/2011 | Liu | |
| 2021/0134779 | A1 | 5/2021 | Huang et al. | |
| 2021/0217811 | A1 * | 7/2021 | Min | H10N 50/80 |
| 2021/0407980 | A1 | 12/2021 | Young et al. | |
| 2022/0093616 | A1 * | 3/2022 | Wei | H10D 30/67 |
| 2022/0367493 | A1 * | 11/2022 | Lee | H01L 29/516 |

* cited by examiner

5B

SEMICONDUCTOR STRUCTURE AND METHOD OF MANUFACTURING SEMICONDUCTOR STRUCTURE

PRIORITY CLAIM AND CROSS-REFERENCE

This application claims priority over U.S. Provisional Application No. 63/303,818 filed Jan. 27, 2022, the disclosure of which is hereby incorporated by reference in its entirety.

BACKGROUND

Thermal tolerance of CMOS devices limits the material selection of ferroelectric memories formed thereon. In addition, CMOS devices suffer from low reliability issues doe to its low stress tolerance to deformation of ferroelectric memories under operation.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
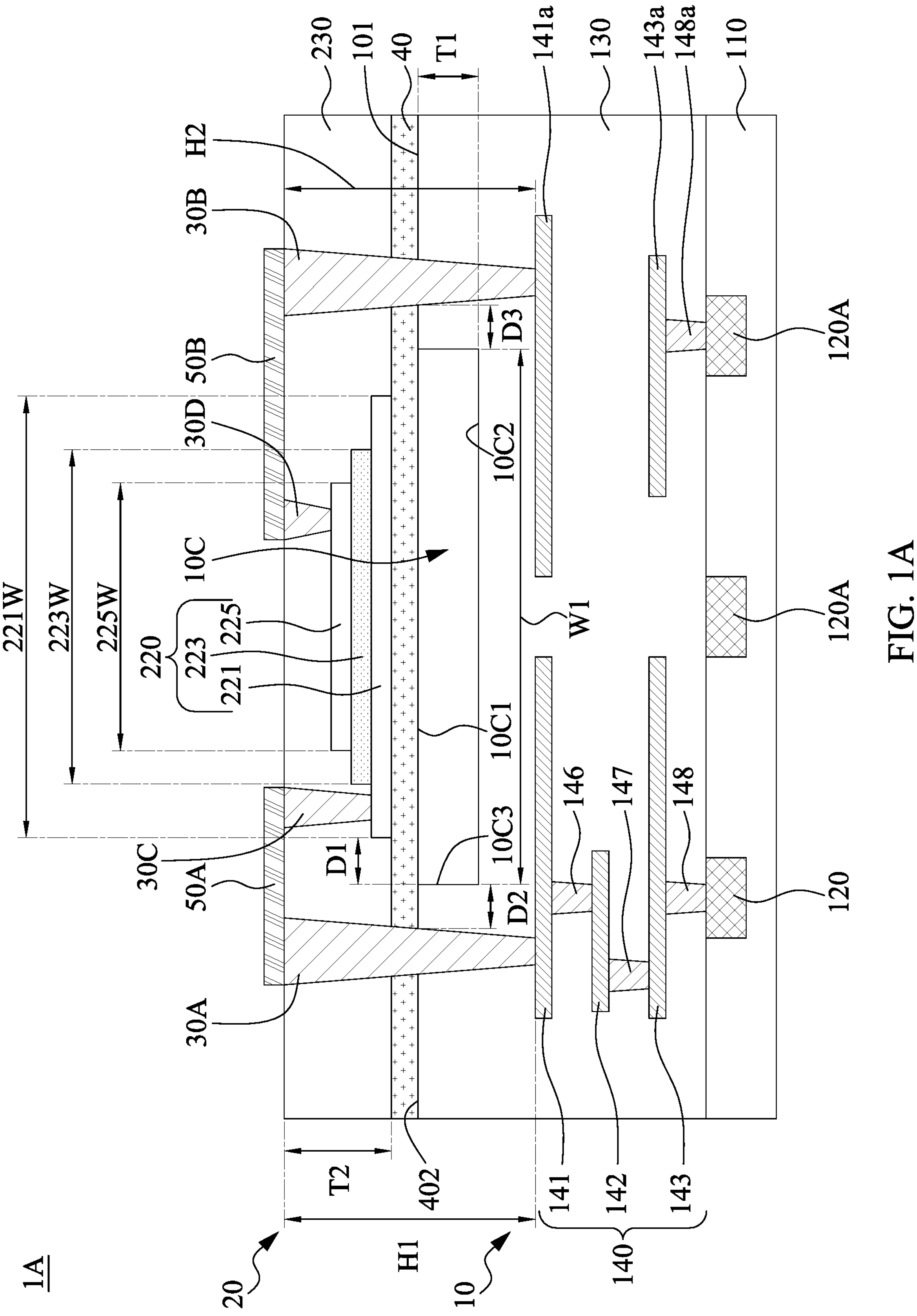
FIG. 1A is a cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Embodiments of the present disclosure discuss semiconductor structures including wafers that are separately manufactured and then bonded to each other with electrical connection there between achieved by inter die vias (IDVs). As such, the processing temperature of the ferroelectric memories of one of the wafers can be free from being affected or limited by the processing temperature of the CMOS devices of the other wafer. Therefore, the selection of the ferroelectric material can be more flexible, and thus the performance of the ferroelectric memories can be relatively satisfactory according to actual applications.

FIG. 1A is a cross-sectional view of a semiconductor structure 1A in accordance with some embodiments of the present disclosure.

Referring to FIG. 1A, in some embodiments, the semiconductor structure 1A includes dies 10 and 20, IDVs 30A and 30B, vias 30C and 30D, an insulating support layer 40, and conductive layers 50A and 50B.

The die 10 may include a semiconductor substrate 110. The semiconductor substrate 110 may include silicon, germanium, silicon germanium, or other proper semiconductor materials. The semiconductor substrate 110 may be a bulk substrate or constructed as a semiconductor on an insulator (SOI) substrate.

In some embodiments, the die 10 includes one or more CMOS devices (e.g., CMOS devices 120 and 120A). In some embodiments, the CMOS devices 120 and 120A are formed on or in the semiconductor substrate 110. The semiconductor substrate 110 may further include one or more isolation structures (not shown in drawings) which define the active regions where the CMOS devices 120 and 120A are formed.

In some embodiments, the die 10 further includes a dielectric structure 130 and an interconnection structure 140 in the dielectric structure 130. In some embodiments, the dielectric structure 130 and the interconnection structure 140 are disposed or formed on the semiconductor substrate 110. In some embodiments, the interconnection structure 140 electrically connects to the CMOS devices 120 and 120A. In some embodiments, the interconnection structure 140 includes one or more conductive layers (e.g., conductive layers 141, 141*a*, 142, 143, and 143*a*) and one or more conductive vias (e.g., conductive vias 146, 147, 148, and 148*a*) electrically connected to the conductive layers. In some embodiments, the bottommost conductive via 148 of the interconnection structure 140 electrically connects to the CMOS device 120. In some embodiments, the bottommost conductive via 148*a* of the interconnection structure 140 electrically connects to the CMOS device 120A. In some embodiments, the CMOS devices 120 and 120A are configured to perform different functions according to actual applications.

The dielectric structure 130 may be or include an interlevel dielectric (ILD) layer. The dielectric structure 130 may include, but are not limited to, $SiN_x$, $SiO_x$, SiON, SiC, SiBN, SiCBN, or any combinations thereof. The conductive layers and the conductive vias of the interconnection structure 140 may include various conductive materials, such as copper (Cu), tungsten (W), cobalt (Co), aluminum (Al), tantalum (Ta), tantalum nitride (TaN), titanium nitride (TiN), an alloy thereof, a combination therefore, or the like, but the present disclosure is not limited thereto.

In some embodiments, the die 10 has a cavity 10C. In some embodiments, the cavity 10C is underneath the die 20. In some embodiments, the dielectric structure 130 of the die 10 has the cavity 10C. In some embodiments, the cavity 10C is an enclosed space defined by the dielectric structure 130. In some embodiments, the cavity 10C is filled with air or an inert gas, such as nitrogen or argon.

In some embodiments, the cavity 10C is exposed by an upper surface 101 of the die 10. In some embodiments, the cavity 10C is exposed by an upper surface (e.g., the upper surface 101) of the dielectric structure 130. In some embodiments, the cavity 10C has a depth T1 of equal to or greater than about 0.1 μm. In some embodiments, the depth T1 of the cavity 10C is from about 0.1 μm to about 100 μm, from about 0.1 μm to about 50 μm, from about 0.1 μm to about 20 μm, from about 0.1 μm to about 10 μm, from about 0.1 μm to about 5 μm, or from about 0.1 μm to about 1 μm. In some embodiments, the cavity 10C has a width W1 of equal to or greater than about 5 μm. In some embodiments, the width W1 of the cavity 10C is from about 5 μm to about 100 μm.

In some embodiments, the interconnection structure 140 is spaced apart from the cavity 10C. In some embodiments, the interconnection structure 140 is covered by the dielectric structure 130. In some embodiments, the conductive layers and the conductive vias are free from being exposed to the cavity 10C.

In some embodiments, the cavity 10C has a bottom surface 10C2, an upper surface 10C1, and a plurality of side surfaces 10C3. In some embodiments, the side surfaces 10C3 of the cavity 10C are substantially planar or flat surfaces. In some embodiments, the side surfaces 10C3 of the cavity 10C are substantially perpendicular to the bottom surface 10C2 of the cavity 10C. In some embodiments, the side surfaces 10C3 of the cavity 10C are substantially straight sidewalls. In some embodiments, the bottom surface 10C2 of the cavity 10C is a substantially planar or flat surface.

The die 20 may include one or more semiconductor devices 220. In some embodiments, the die 20 includes a ferroelectric layer 223. In some embodiments, the semiconductor device 220 includes electrodes 221 and 225 and the ferroelectric layer 223. In some embodiments, the ferroelectric layer 223 is between the electrode 221 and the electrode 225. In some embodiments, a width 225W of the electrode 225 is less than a width 223W of the ferroelectric layer 223. In some embodiments, the width 223W of the ferroelectric layer 223 is less than a width 221W of the electrode 221. In some embodiments, a peripheral region of the ferroelectric layer 223 is exposed by and surrounding the electrode 225. In some embodiments, an edge of the ferroelectric layer 223 is recessed from or separated from an edge of the electrode 221 by about 0.1 μm to about 10 μm. In some embodiments, an edge of the electrode 225 is recessed from or separated from an edge of the ferroelectric layer 223 by about 0.1 μm to about 10 μm. In some embodiments, the semiconductor device 220 is or includes a memory element. In some embodiments, the semiconductor device 220 including the electrodes 221 and 225 and the ferroelectric layer 223 is a ferroelectric memory.

In some embodiments, the electrodes 221 and 225 may include any suitable conductive material. In some embodiments, the electrodes 221 and 225 may include Pt, Cu, W, Co, Al, Ta, TaN, TiN, an alloy thereof, a combination therefore, or the like. In some embodiments, a material of the ferroelectric layer 223 may be or include any suitable ferroelectric material. In some embodiments, the ferroelectric layer 223 may include hafnium dioxide ($HfO_2$), hafnium silicide oxide ($HfSiO_x$), hafnium zirconium oxide ($HfZrO_x$), aluminum oxide ($Al_2O_3$), titanium dioxide ($TiO_2$), lanthanum oxide ($LaO_x$), barium strontium titanate oxide ($BaSrTiO_x$, BST), lead zirconate titanate oxide ($PbZrTiO_x$, PZT), or the like, wherein a value of x is greater than zero and smaller than 1. In some embodiments, a thickness of the ferroelectric layer 223 is equal to or greater than about 0.1 μm. In some embodiments, a thickness of the ferroelectric layer 223 is from about 0.1 μm to about 10 μm, from about 0.1 μm to about 5 μm, from about 0.1 μm to about 1 μm, or from about 0.1 μm to about 0.5 μm.

In some embodiments, a processing temperature of the semiconductor device 220 of the die 20 is higher than a processing temperature of the CMOS device 120 of the die 10. In some embodiments, a processing temperature of the ferroelectric layer 223 is higher than a processing temperature of the CMOS device 120 of the die 10. In some embodiments, the processing temperature of the ferroelectric layer 223 is higher than the processing temperature of the CMOS device 120 of the die 10 by about 100° C. or greater. In some embodiments, the processing temperature of the ferroelectric layer 223 is higher than about 500° C., about 600° C., or about 700° C. For example, in some cases where the ferroelectric layer 223 of the semiconductor die 20 is PZT, after the ferroelectric layer 223 is initially deposited the ferroelectric layer 223 is dried and prepared for calcining. The calcining process occurs at greater than 600° C. and in some cases can even exceed 1000° C., whereby the PZT compound is raised to high temperature without melting in the absence of oxygen, to remove impurities or volatile substances and thereby provide a high quality PZT material. These temperatures are high enough to be detrimental to the CMOS device 120, for example by causing unacceptable diffusion of dopants from the channel region and/or source/drain regions of the transistors to alter the threshold voltages or other issues arising from such high temperatures. Thus, in some embodiments, the ferroelectric layer 223 is formed on the semiconductor die 20 and a calcining process is carried out on the semiconductor die 20 prior to wafer bonding. Then, only after calcining has occurred, is the die 20 bonded to the die 10 by use of the IDVs 30A, 30B, thereby providing a high quality PZT ferroelectric material that is integrated together with CMOS devices. Thus, the high temperature PZT ferroelectric material, which can be processed at 600° C. or more is compatible with CMOS devices that have a thermal budget of less than 425° C.

The die 20 may further include a dielectric structure 230 (also referred to as "a passivation layer"), and the one or more semiconductor devices 220 may be formed in the dielectric structure 230. In some embodiments, a hardness of the dielectric structure 230 of the die 20 is less than a hardness of the dielectric structure 130 of the die 10. In some embodiments, the dielectric structure 230 has a thickness T2 from about 0.5 μm to about 100 μm. The dielectric structure 230 may be or include silicon oxide, silicon oxynitride, silicon nitride, or any combination thereof.

In some embodiments, the semiconductor device 220 is over the cavity 10C of the die 10. In some embodiments, the cavity 10C is underneath the semiconductor device 220. In some embodiments, the cavity 10C is directly under the semiconductor device 220. In some embodiments, the ferroelectric layer 223 of the semiconductor device 220 is over the cavity 10C of the die 10. In some embodiments, the cavity 10C is underneath the ferroelectric layer 223. In some embodiments, the cavity 10C is directly under the ferroelectric layer 223. In some embodiments, a projection of the semiconductor device 220 is entirely within a projection of the cavity 10C. In some embodiments, a projection of the ferroelectric layer 223 is entirely within a projection of the cavity 10C. In some embodiments, an edge of the semiconductor device 220 (or the electrode 221) is recessed from or separated from an edge of the cavity 10C by a distance D1 of equal to or greater than about 1 μm. In some embodiments, an edge of the semiconductor device 220 (or the electrode 221) is recessed from or separated from an edge of the cavity 10C by a distance D1 from about 1 μm to about 10 μm, from about 1 μm to about 5 μm, from about 1 μm to about 3 μm, or from about 1 μm to about 2 μm. In some embodiments, the distance D2 may be the same as or different from the distance D3.

The cavity 10C can be advantageous, as during data storage operations, the application of a potential over the ferroelectric layer 223 can induce stress that deforms the ferroelectric material. Thus, in the absence of the cavity, this stress would attempt to "bend" or "bow" the ferroelectric layer 223, but the solid body of material surrounding the ferroelectric layer would resist this bending or bowing, leading to harmful stress in the ferroelectric layer. By including the cavity 10C, the ferroelectric layer is now free to distort its shape (e.g., is free to "bend" or "bow"-see e.g., FIG. 1G) in the response to the stress resulting from the application of the potential. Thus, in some embodiments, the ferroelectric layer 223 is disposed directly over the cavity, and the ferroelectric layer 223 has bend or bow that carries through to the upper surface 10C1 of the cavity, whereby the curved upper surface of the cavity evidences the alleviation of stress that would otherwise be imparted to the ferroelectric layer 223.

Still referring to FIG. 1A, the IDVs 30A and 30B may electrically connect the die 10 to the die 20. In some embodiments, the IDV 30A electrically connects the semiconductor device 220 (or the memory element) to the CMOS device 120 of the die 10. In some embodiments, the IDV 30A electrically connects the electrode 221 of the semiconductor device 220 to the CMOS device 120. The CMOS device 120 may be configured to control the semiconductor device 220 (or the memory element). In some embodiments, the IDV 30A penetrates the die 10 and the die 20 to electrically connect the CMOS device 120 to the electrode 221 of the semiconductor device 220. In some embodiments, the IDV 30A penetrates the dielectric structure 130 and the dielectric structure 230 to electrically connect the CMOS device 120 to the electrode 221 of the semiconductor device 220. In some embodiments, the IDV 30A extends along a side of the cavity 10C. In some embodiments, the IDV 30A extends below or exceeding the bottom surface 10C2 the cavity 10C. In some embodiments, the IDV 30A is separated from an edge of the cavity 10C by a distance D2 of equal to or greater than about 0.5 μm. In some embodiments, the IDV 30A is separated from an edge of the cavity 10C by a distance D2 from about 0.5 μm to about 10 μm, from about 0.5 μm to about 5 μm, from about 0.5 μm to about 3 μm, or from about 0.5 μm to about 1 μm.

In some embodiments, the IDV 30B electrically connects the semiconductor device 220 to the conductive layer 141*a* of the interconnection structure 140. In some embodiments, the IDV 30B penetrates the die 10 and the die 20 to electrically connect the semiconductor device 220 to the conductive layer 141*a* of the interconnection structure 140. In some embodiments, the IDV 30B penetrates the dielectric structure 130 and the dielectric structure 230 to electrically connect the semiconductor device 220 to the conductive layer 141*a* of the interconnection structure 140. In some embodiments, the IDV 30B extends along a side of the cavity 10C. In some embodiments, the IDV 30B extends below or exceeding a bottom surface 10C2 the cavity 10C. In some embodiments, the IDV 30B is separated from an edge of the cavity 10C by a distance D3 of equal to or greater than about 0.5 μm. In some embodiments, the IDV 30B is separated from an edge of the cavity 10C by a distance D3 from about 0.5 μm to about 10 μm, from about 0.5 μm to about 5 μm, from about 0.5 μm to about 3 μm, or from about 0.5 μm to about 1 μm.

In some embodiments, the IDV 30A electrically connects to the electrode 221 through the conductive layer 50A and via 30C. In some embodiments, the IDV 30A penetrates the dielectric structure 230. In some embodiments, the IDV 30B electrically connects to the electrode 225 through the conductive layer 50B and via 30D. In some embodiments, the IDV 30B penetrates the dielectric structure 230.

In some embodiments, the IDV 30A has a height H1 of equal to or greater than about 1 μm. In some embodiments, the IDV 30A has a height H1 from about 1 μm to about 100 μm, from about 1 μm to about 80 μm, from about 1 μm to about 50 μm, or from about 1 μm to about 20 μm. In some embodiments, the IDV 30B has a height H2 of equal to or greater than about 1 μm. In some embodiments, the IDV 30B has a height H2 from about 1 μm to about 100 μm, from about 1 μm to about 80 μm, from about 1 μm to about 50 μm, or from about 1 μm to about 20 μm. In some embodiments, the height H1 of the IDV 30A may be the same as or different from the height H2 of the IDV 30B.

In some embodiments, the conductive layers 50A and 50B are disposed or formed on the dielectric structure 230 of the die 20. The conductive layers 50A and 50B may include Cu, W, Co, Al, Ta, TaN, TiN, an alloy thereof, a combination therefore, or the like.

The insulating support layer 40 may be disposed or formed between the ferroelectric layer 223 and the cavity 10C. In some embodiments, the insulating support layer 40 is disposed or formed between the semiconductor device 220 and the cavity 10C. In some embodiments, a portion of a bottom surface 402 of the insulating support layer 40 is exposed to the cavity 10C. In some embodiments, the cavity 10C is an enclosed space defined by the dielectric structure 130 and the insulating support layer 40. In some embodiments, the IDVs 30A and 30B penetrate the die 10 and the insulating support layer 40 to electrically connect to the semiconductor device 220. In some embodiments, the insulating support layer 40 has a thickness from about 3 μm to about 10 μm, from about 4 μm to about 8 μm, or from about 5 μm to about 6 μm. In some embodiments, the insulating support layer 40 may include any suitable insulating material. In some embodiments, the insulating support layer 40 includes silicon oxide, silicon nitride, silicon oxynitride, polysilicon (e.g., un-doped polysilicon), or a combination thereof.

Figure 1B:
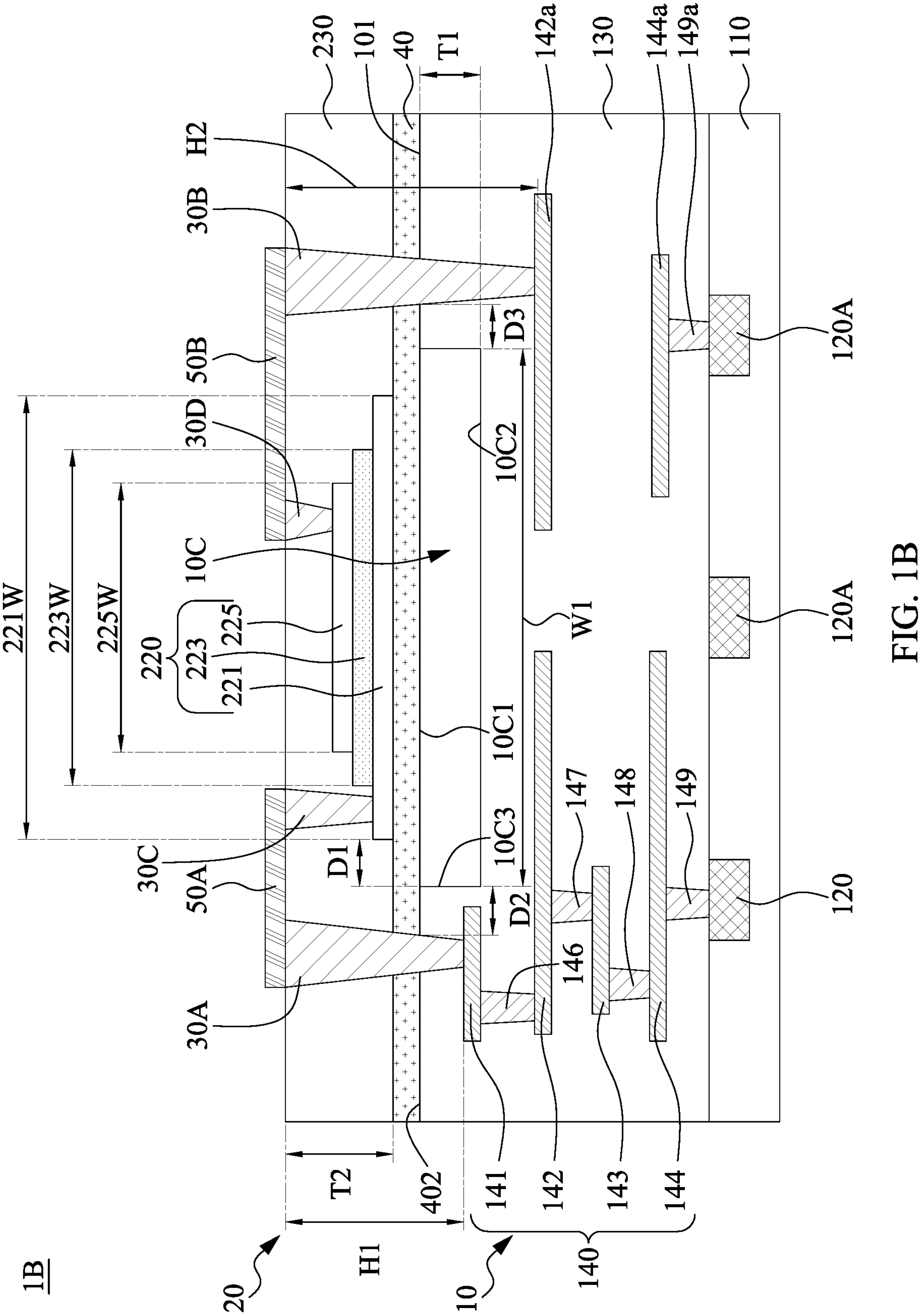
FIG. 1B is a cross-sectional view of a semiconductor structure in accordance with some embodiments of the present disclosure.

FIG. 1B is a cross-sectional view of a semiconductor structure 1B in accordance with some embodiments of the present disclosure. In some embodiments, the semiconductor structure 1B is similar to the semiconductor structure 1A in FIG. 1A, with differences there between as follows. Descriptions of similar components are omitted.

In some embodiments, the interconnection structure 140 includes one or more conductive layers (e.g., conductive layers 141, 142, 142*a*, 143, 144, and 144*a*) and one or more conductive vias (e.g., conductive vias 146, 147, 148, 149, and 149*a*) electrically connected to the conductive layers. In some embodiments, the bottommost conductive via 149 of the interconnection structure 140 electrically connects to the CMOS device 120. In some embodiments, the bottommost conductive via 149*a* of the interconnection structure 140 electrically connects to the CMOS device 120A. In some embodiments, the IDV 30B electrically connects the semiconductor device 220 to the conductive layer 142*a* of the interconnection structure 140.

In some embodiments, the IDV 30A extends along a side of the cavity 10C and stops before reaching an elevation of the bottom surface 10C2 of the cavity 10C. In some embodiments, a bottom surface of the IDV 30A is at an elevation higher than the elevation of the bottom surface 10C2 of the cavity 10C. The IDV 30A electrically connects to the CMOS device 120 through the conductive layers 141, 142, 143, and 144 and the conductive vias 146, 147, 148, and 149.

Figure 1C:
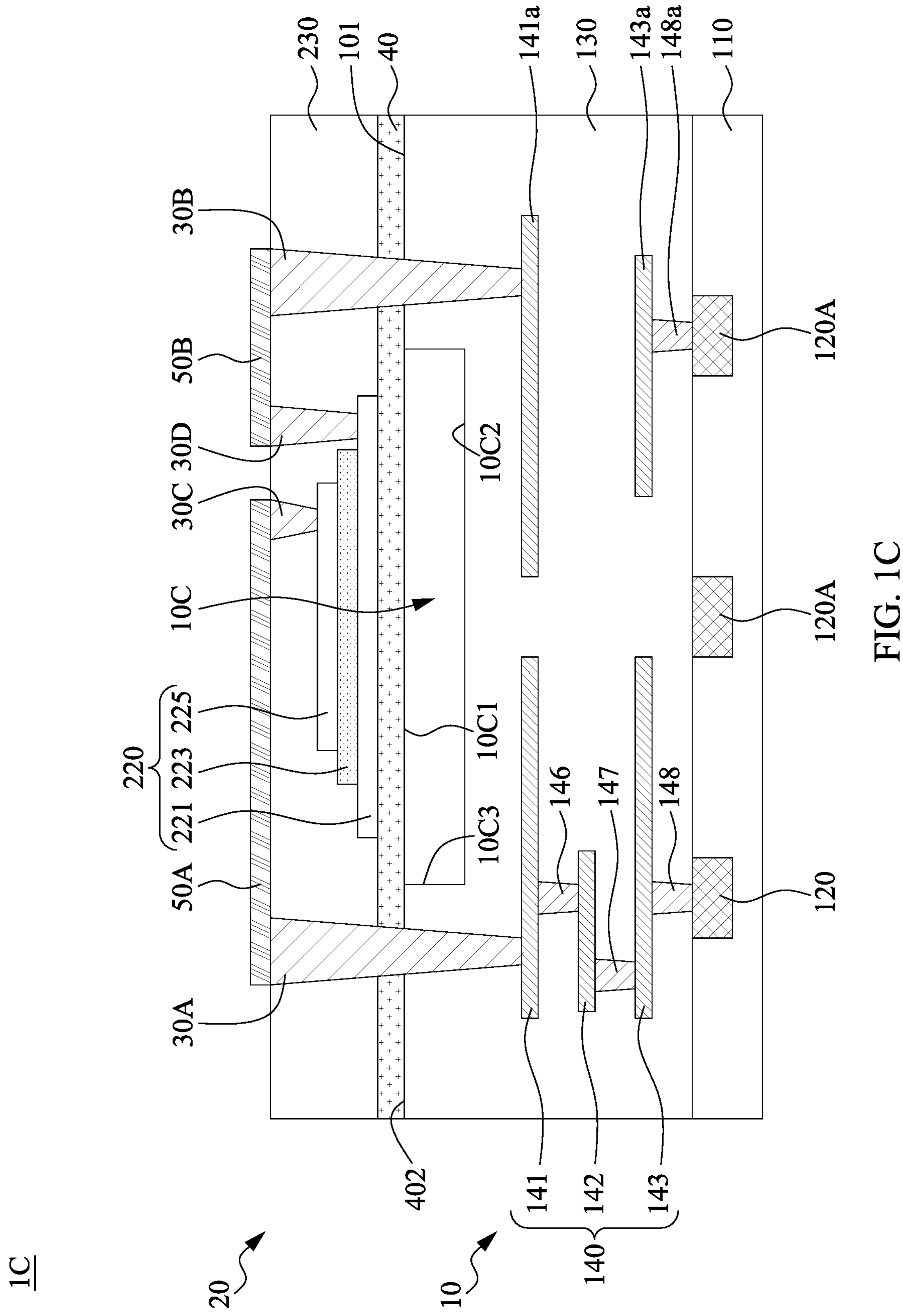
FIG. 1C is a cross-sectional view of a semiconductor structure in accordance with some embodiments of the present disclosure.

FIG. 1C is a cross-sectional view of a semiconductor structure 1C in accordance with some embodiments of the present disclosure. In some embodiments, the semiconductor structure 1C is similar to the semiconductor structure 1A in FIG. 1A, with differences there between as follows. Descriptions of similar components are omitted.

In some embodiments, the IDV 30A electrically connects the electrode 225 of the semiconductor device 220 to the CMOS device 120. In some embodiments, the via 30C electrically connects the electrode 225 to the IDV 30A. In some embodiments, the IDV 30B electrically connects the electrode 221 of the semiconductor device 220 to the conductive layer 141*a* of the interconnection structure 140. In some embodiments, the via 30D electrically connects the electrode 221 to the IDV 30B.

Figure 1D:
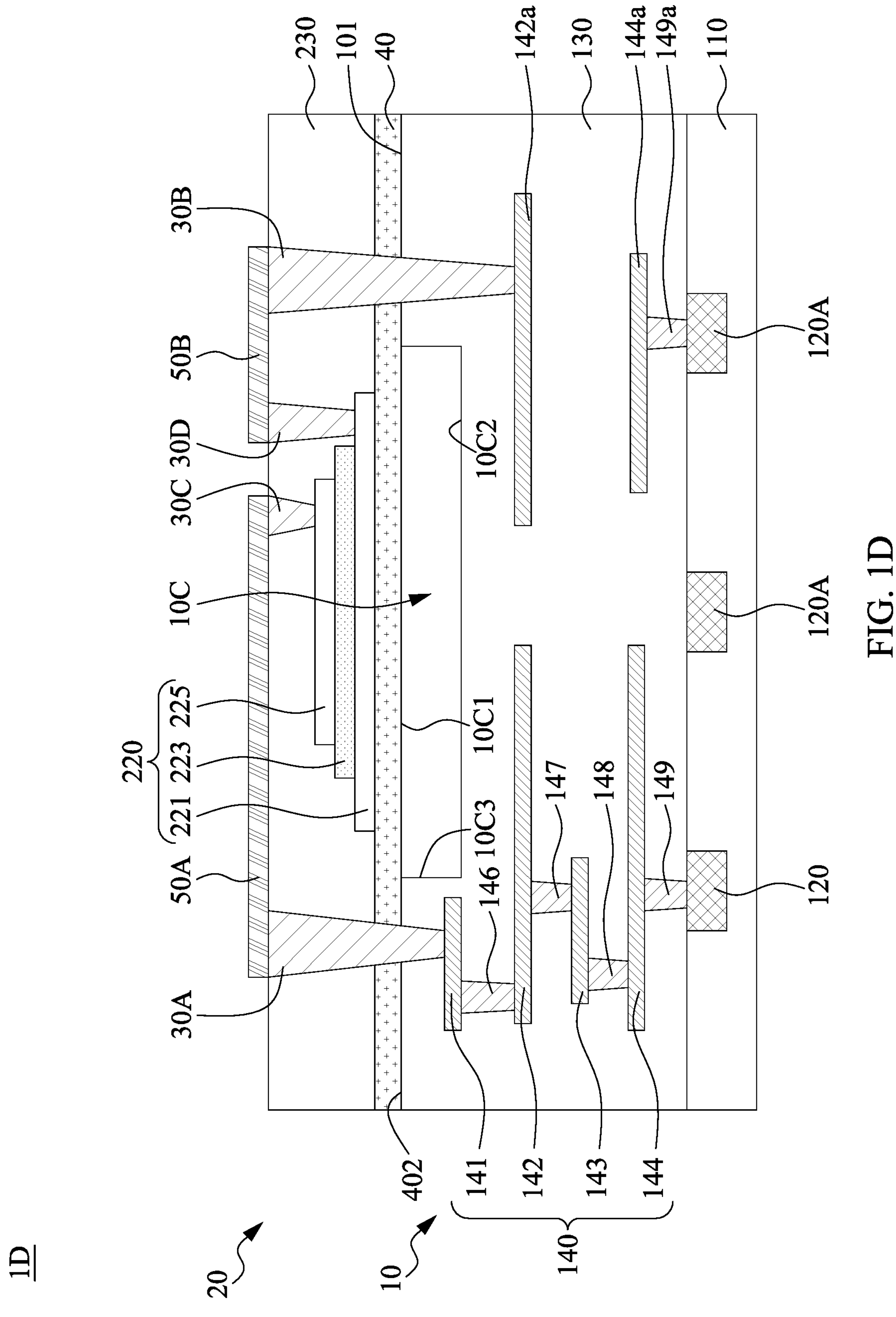
FIG. 1D is a cross-sectional view of a semiconductor structure in accordance with some embodiments of the present disclosure.

FIG. 1D is a cross-sectional view of a semiconductor structure 1D in accordance with some embodiments of the present disclosure. In some embodiments, the semiconductor structure 1D is similar to the semiconductor structure 1A in FIG. 1A, with differences there between as follows. Descriptions of similar components are omitted.

In some embodiments, the IDV 30A electrically connects the electrode 225 of the semiconductor device 220 to the CMOS device 120. In some embodiments, the via 30C electrically connects the electrode 225 to the IDV 30A. In some embodiments, the IDV 30B electrically connects the electrode 221 of the semiconductor device 220 to the conductive layer 142*a* of the interconnection structure 140. In some embodiments, the via 30D electrically connects the electrode 221 to the IDV 30B.

Figure 1E:
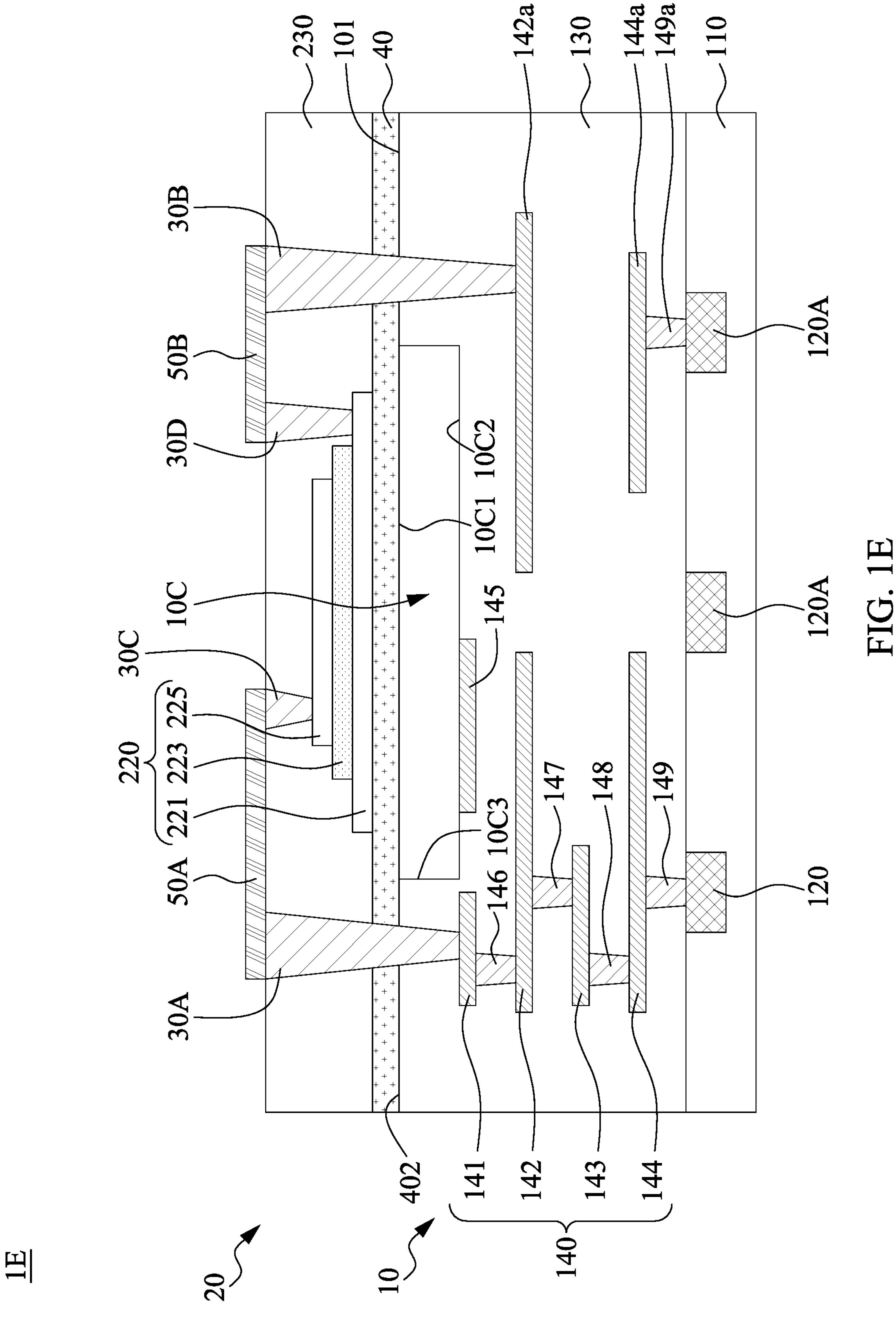
FIG. 1E is a cross-sectional view of a semiconductor structure in accordance with some embodiments of the present disclosure.

FIG. 1E is a cross-sectional view of a semiconductor structure 1E in accordance with some embodiments of the present disclosure. In some embodiments, the semiconductor structure 1E is similar to the semiconductor structure 1A in FIG. 1A, with differences there between as follows. Descriptions of similar components are omitted.

In some embodiments, the interconnection structure 140 includes one or more conductive layers (e.g., conductive layers 141, 142, 142*a*, 143, 144, 144*a*, and 145) and one or more conductive vias (e.g., conductive vias 146, 147, 148, 149, and 149*a*) electrically connected to the conductive layers. In some embodiments, the bottommost conductive via 149 of the interconnection structure 140 electrically connects to the CMOS device 120. In some embodiments, the bottommost conductive via 149*a* of the interconnection structure 140 electrically connects to the CMOS device 120A. In some embodiments, the IDV 30B electrically connects the semiconductor device 220 to the conductive layer 142*a* of the interconnection structure 140.

In some embodiments, the interconnection structure 140 is exposed to the cavity 10C. In some embodiments, the interconnection structure 140 is exposed from the dielectric structure 130. In some embodiments, the conductive layer 145 is exposed to the cavity 10C. In some embodiments, the cavity 10C is filled with an inert gas, such as nitrogen or argon.

Figure 1F:
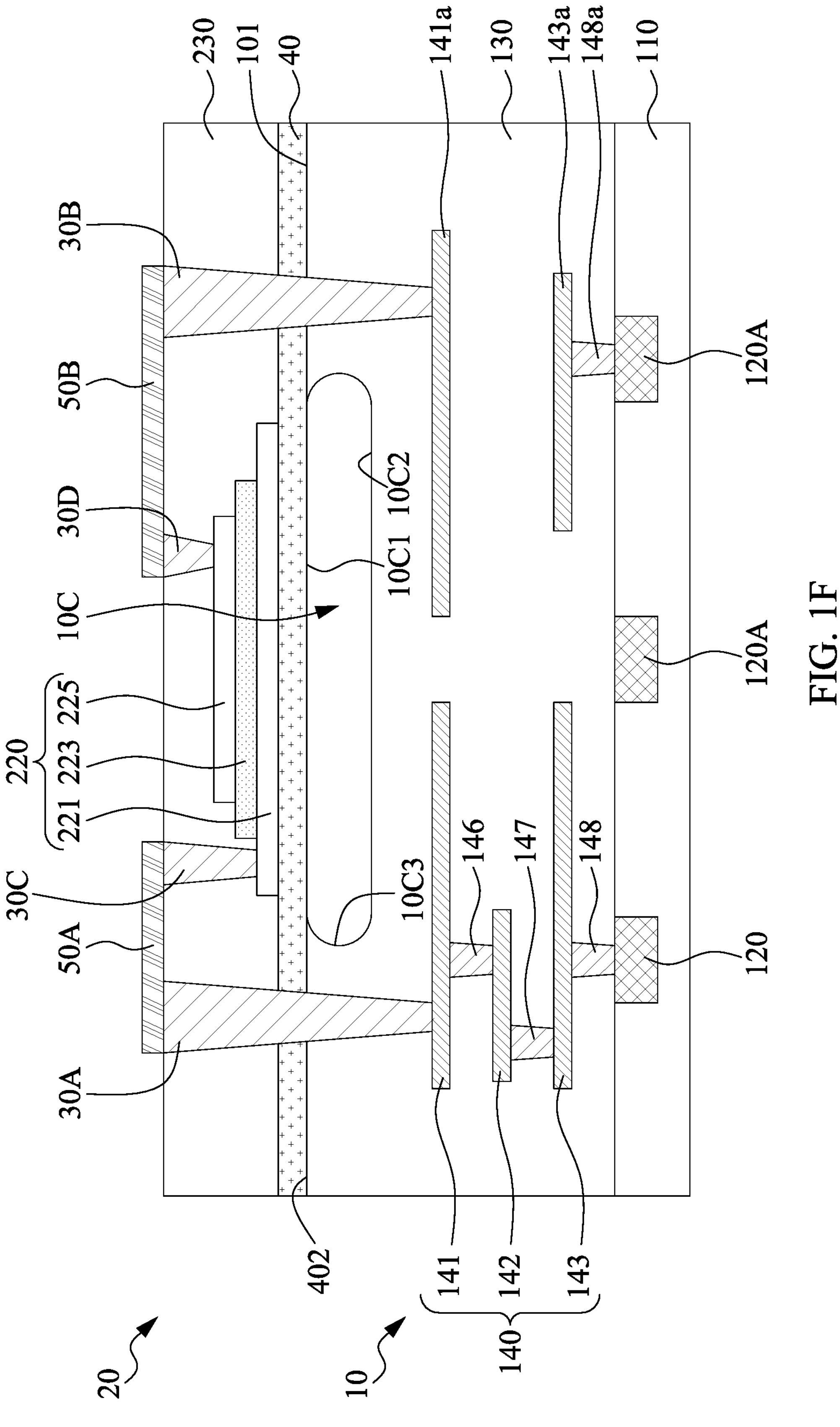
FIG. 1F is a cross-sectional view of a semiconductor structure in accordance with some embodiments of the present disclosure.
Figure 1G:
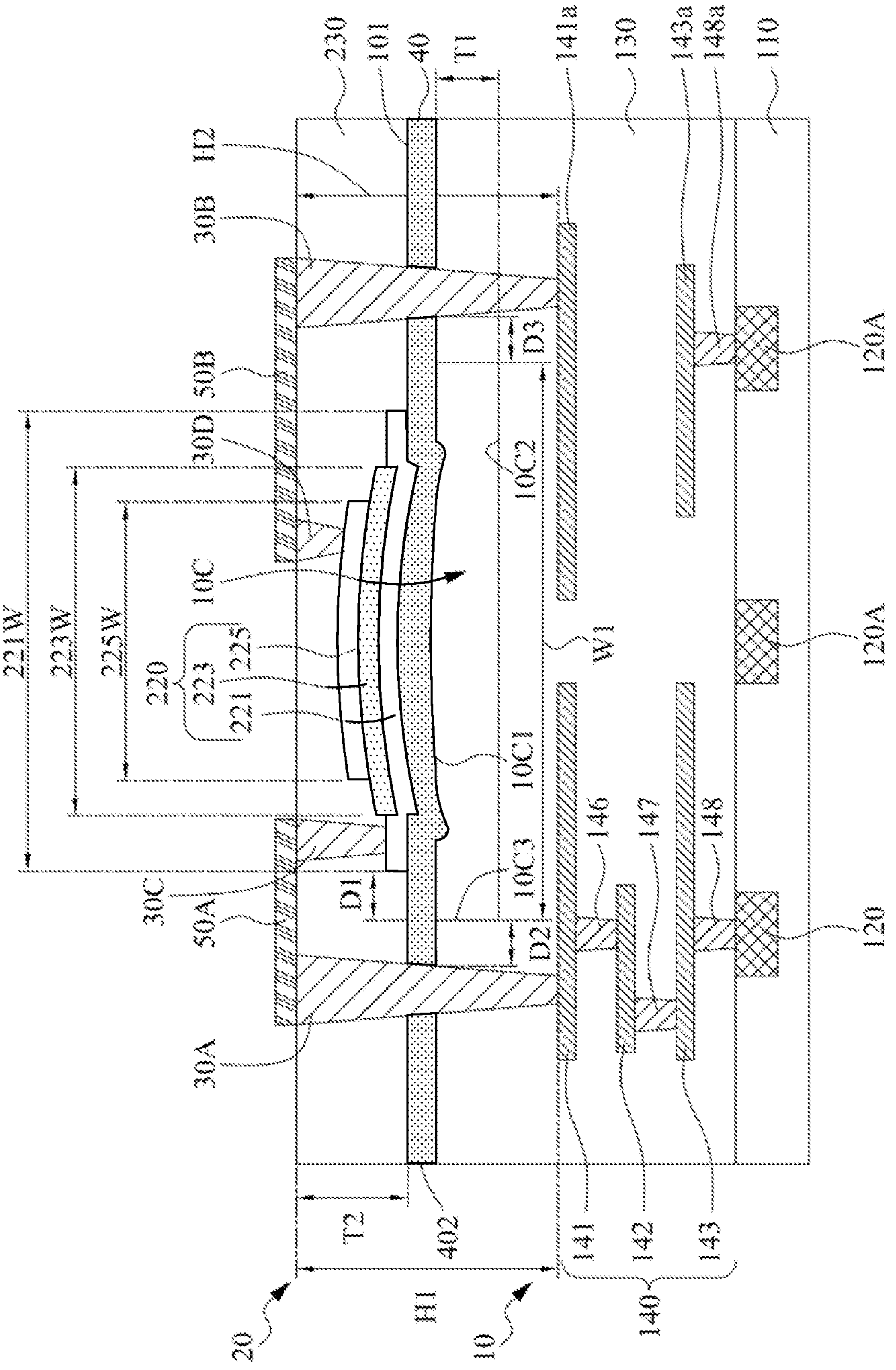
FIG. 1G is a cross-sectional view of a semiconductor structure in accordance with some embodiments of the present disclosure.

FIG. 1F is a cross-sectional view of a semiconductor structure 1F in accordance with some embodiments of the present disclosure. In some embodiments, the semiconductor structure 1F is similar to the semiconductor structure 1A in FIG. 1A, with differences there between as follows. Descriptions of similar components are omitted.

In some embodiments, the side surfaces 10C3 of the cavity 10C are curved surfaces. In some embodiments, the bottom surface 10C2 of the cavity 10C is a curved surfaces. In some embodiments, the side surface 10C3 and the bottom surface 10C2 form a curved corner.

Figure 2:
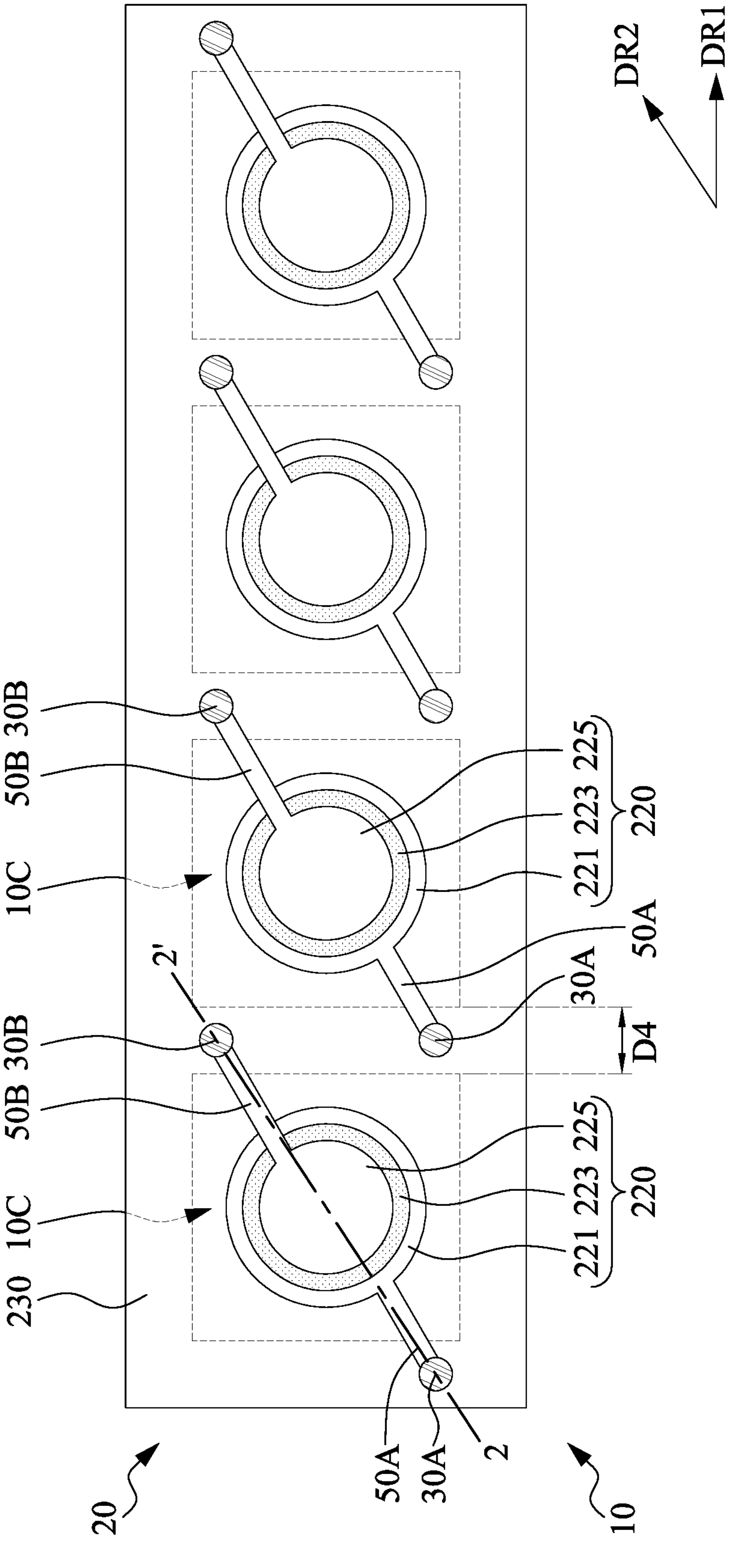
FIG. 2 is a top view of a semiconductor structure in accordance with some embodiments of the present disclosure.

FIG. 2 is a top view of a semiconductor structure 2 in accordance with some embodiments of the present disclosure. In some embodiments, FIG. 1A, FIG. 1B, FIG. 1C, FIG. 1D, FIG. 1E, FIG. 1F, and/or FIG. 1G may illustrate a cross-sectional view of a portion of the semiconductor structure 2 along the cross-sectional line 2-2' in FIG. 2.

In some embodiments, the die 10 of the semiconductor structure 2 includes a plurality of cavities 10C. In some embodiments, the die 20 of the semiconductor structure 2 includes a plurality of semiconductor devices 220. In some embodiments, the semiconductor structure 2 includes a plurality of semiconductor devices 220 over a plurality of corresponding cavities 10C. In some embodiments, two adjacent cavities 10C are separated from each other by a distance D4 of equal to or greater than about 1 μm. In some embodiments, two adjacent cavities 10C are separated from each other by a distance D4 from about 1 μm to about 100 μm, from about 1 μm to about 50 μm, from about 1 μm to about 10 μm, or from about 1 μm to about 5 μm.

In some embodiments, the semiconductor device 220 is entirely within a projection of the corresponding cavity 10C from a top view perspective. In some embodiments, an area of the ferroelectric layer 223 is less than an area of the corresponding cavity 10C from a top view perspective. In some embodiments, an area of the semiconductor device 220 is less than an area of the corresponding cavity 10C from a top view perspective.

In some embodiments, the IDV 30A of one of the cavities 10C is disposed adjacent to the IDV 30B of an adjacent cavity 10C. In some embodiments, the conductive layers 50A and 50B extend in a direction DR2, the semiconductor devices 220 (or the cavities 10C) are arranged in a direction DR1, and the direction DR1 and the direction DR2 form an angle greater than 0 and less than about 90°. In some embodiments, the structures each including one semiconductor device 220 and the conductive layers 50A and 50B connected thereto are arranged in a staggered fashion. In some embodiments, the structures each including one semiconductor device 220 and the IDVs 30A and 30B connected thereto are arranged in a staggered fashion.

According to some embodiments of the present disclosure, the wafers 10 and 20 are separated manufactured and then bonded to each other with electrical connection there between achieved by IDVs, instead of manufacturing the semiconductor devices 220 (or the ferroelectric memories) directly on the die 10, and thus the processing temperature of the semiconductor devices 220 (or the ferroelectric memories) of the die 20 can be free from being affected or limited by the processing temperature of the CMOS devices of the die 10. Therefore, the selection of the material of the ferroelectric layer 223 can be more flexible, and thus the performance of the semiconductor devices 220 can be relatively satisfactory according to actual applications.

In addition, according to some embodiments of the present disclosure, with the design of the cavity 10C directly underneath the semiconductor device 220 (or the ferroelectric memory), the cavity 10C can provide sufficient buffer space for the deformation of the semiconductor device 220 under operation. Therefore, structures and/or elements of the die 10 can be free from being affected or damaged, and thus the reliability of the semiconductor structure can be improved.

Figure 3A:
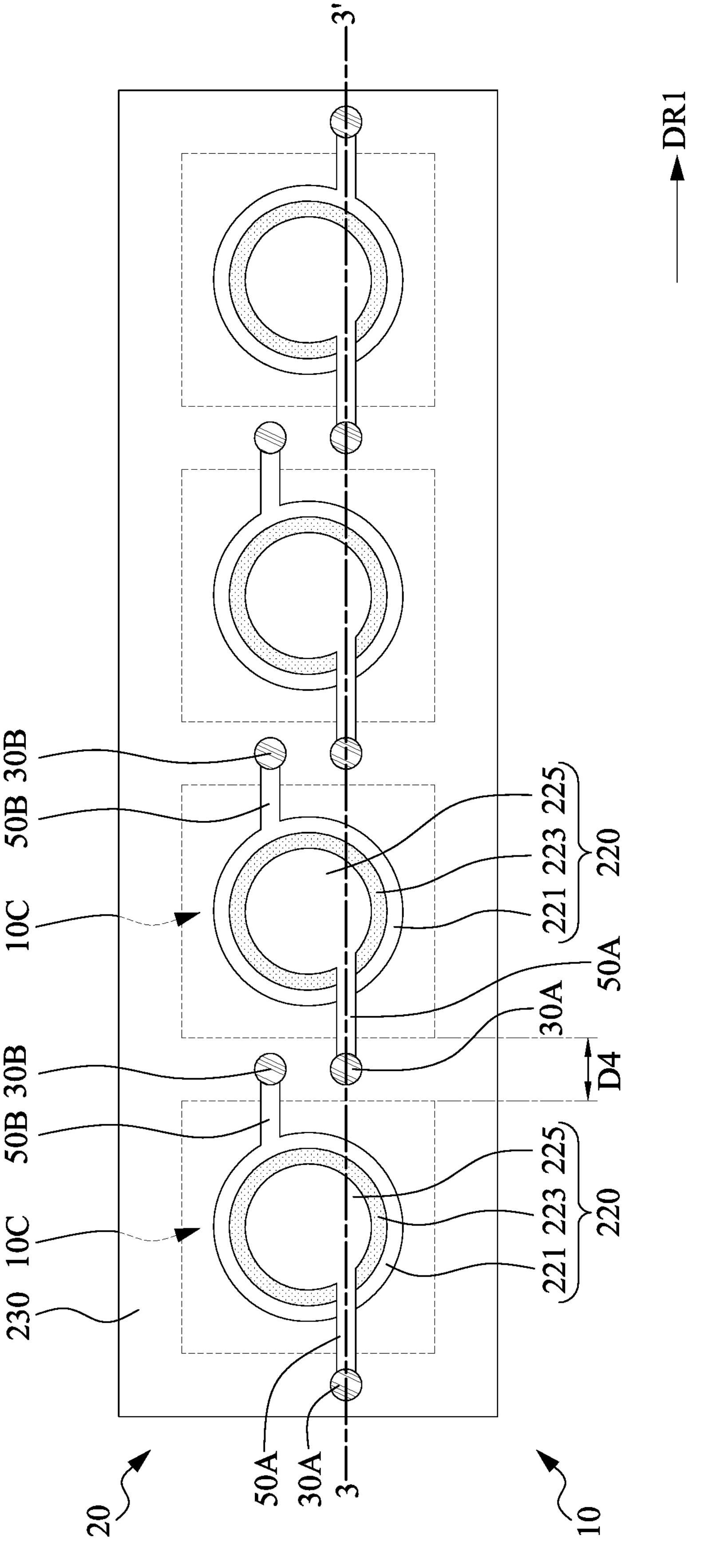
FIG. 3A is a top view of a semiconductor structure in accordance with some embodiments of the present disclosure.

FIG. 3A is a top view of a semiconductor structure 3 in accordance with some embodiments of the present disclosure. In some embodiments, the semiconductor structure 3 is similar to the semiconductor structure 2 in FIG. 2, with differences there between as follows. Descriptions of similar components are omitted.

In some embodiments, the IDV 30A of one of the cavities 10C is disposed adjacent to the IDV 30B of an adjacent cavity 10C. In some embodiments, the conductive layers 50A and 50B extend in the direction DR1, and the semiconductor devices 220 (or the cavities 10C) are arranged in the direction DR1. In some embodiments, the conductive layer 50A and the conductive layer 50B are arranged in a staggered fashion. In some embodiments, the IDV 30A and the IDV 30B are arranged in a staggered fashion.

Figure 3B:
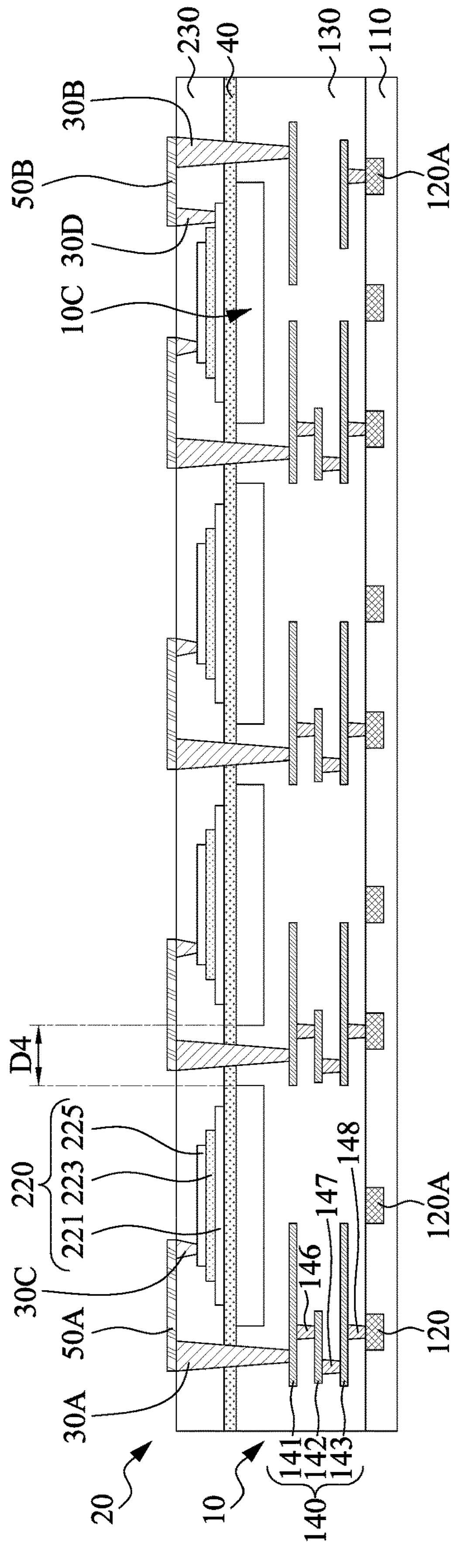
FIG. 3B is a cross-sectional view of a semiconductor structure in accordance with some embodiments of the present disclosure.

FIG. 3B is a cross-sectional view of a semiconductor structure in accordance with some embodiments of the present disclosure. In some embodiments, FIG. 3 may illustrate a cross-sectional view of the semiconductor structure 3 along the cross-sectional line 3-3' in FIG. 3A.

In some embodiments, the die 10 of the semiconductor structure 3 includes a plurality of cavities 10C. In some embodiments, the die 20 of the semiconductor structure 3 includes a plurality of semiconductor devices 220. In some embodiments, the semiconductor structure 3 includes a plurality of semiconductor devices 220 over a plurality of corresponding cavities 10C. In some embodiments, two adjacent cavities 10C are separated from each other by a distance D4 of equal to or greater than about 1 μm. In some embodiments, two adjacent cavities 10C are separated from each other by a distance D4 from about 1 μm to about 100 μm, from about 1 μm to about 50 μm, from about 1 μm to about 10 μm, or from about 1 μm to about 5 μm.

Figure 4:
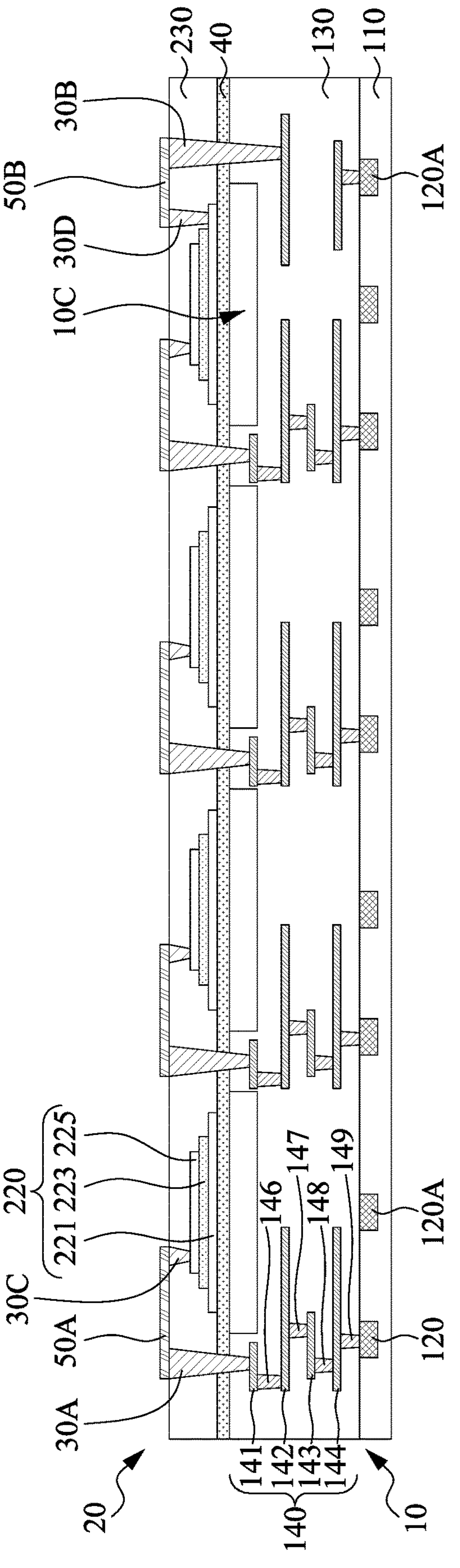
FIG. 4 is a cross-sectional view of a semiconductor structure in accordance with some embodiments of the present disclosure.

FIG. 4 is a cross-sectional view of a semiconductor structure 4 in accordance with some embodiments of the present disclosure. In some embodiments, the semiconductor structure 4 is similar to the semiconductor structure 3 in FIG. 3A, with differences there between as follows. Descriptions of similar components are omitted.

In some embodiments, the conductive layer 141 of the interconnection structure 140 is between adjacent cavities 10C. In some embodiments, each of the bottom surfaces of the IDVs 30A is located between adjacent cavities 10C.

Figure 5A:
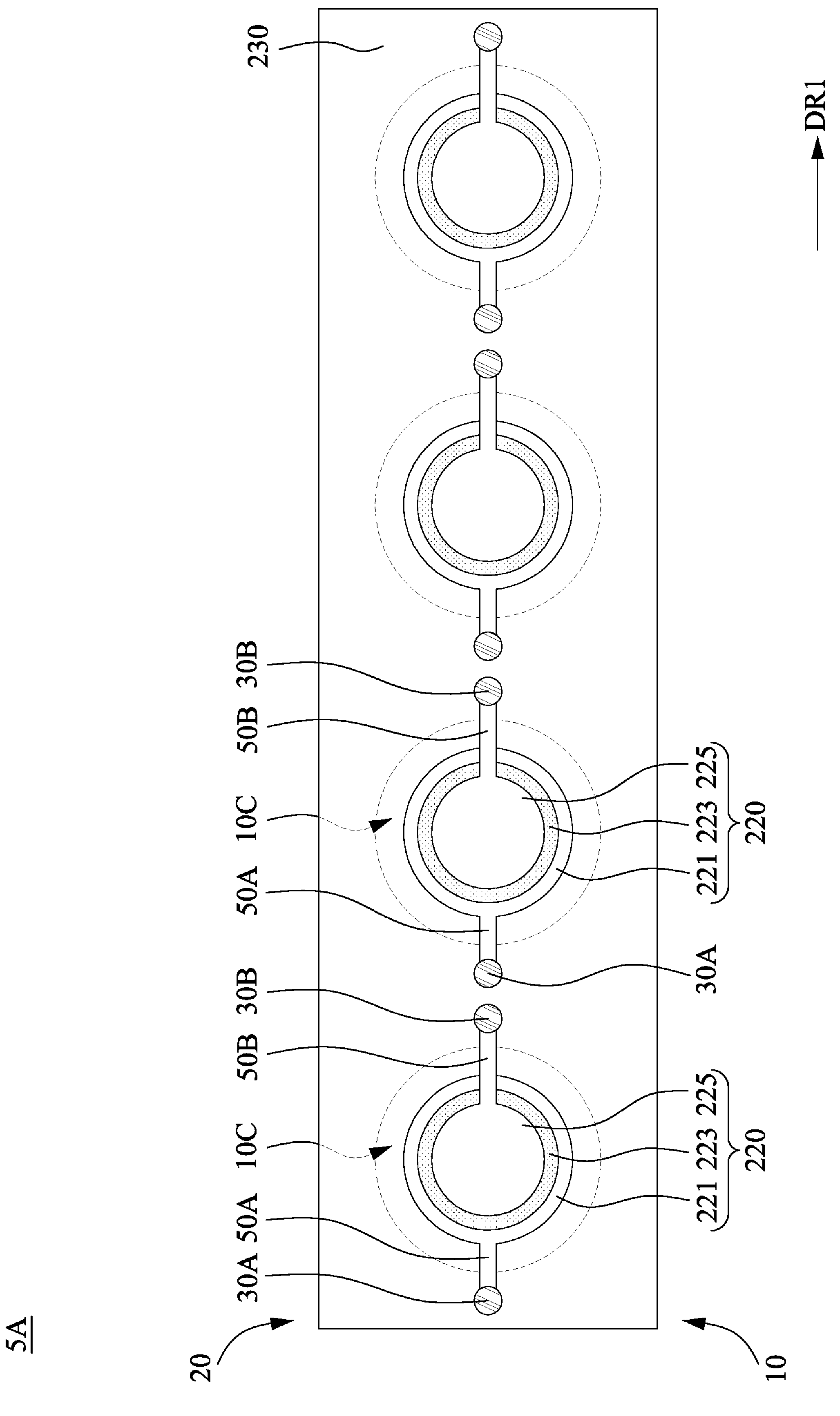
FIG. 5A is a top view of a semiconductor structure in accordance with some embodiments of the present disclosure.

FIG. 5A is a top view of a semiconductor structure 5A in accordance with some embodiments of the present disclosure. In some embodiments, the semiconductor structure 5A is similar to the semiconductor structure 2 in FIG. 2, with differences there between as follows. Descriptions of similar components are omitted.

In some embodiments, the conductive layers 50A and 50B are substantially aligned in the direction DR1. In some embodiments, the IDVs 30A and 30B are substantially aligned in the direction DR1.

Figure 5B:
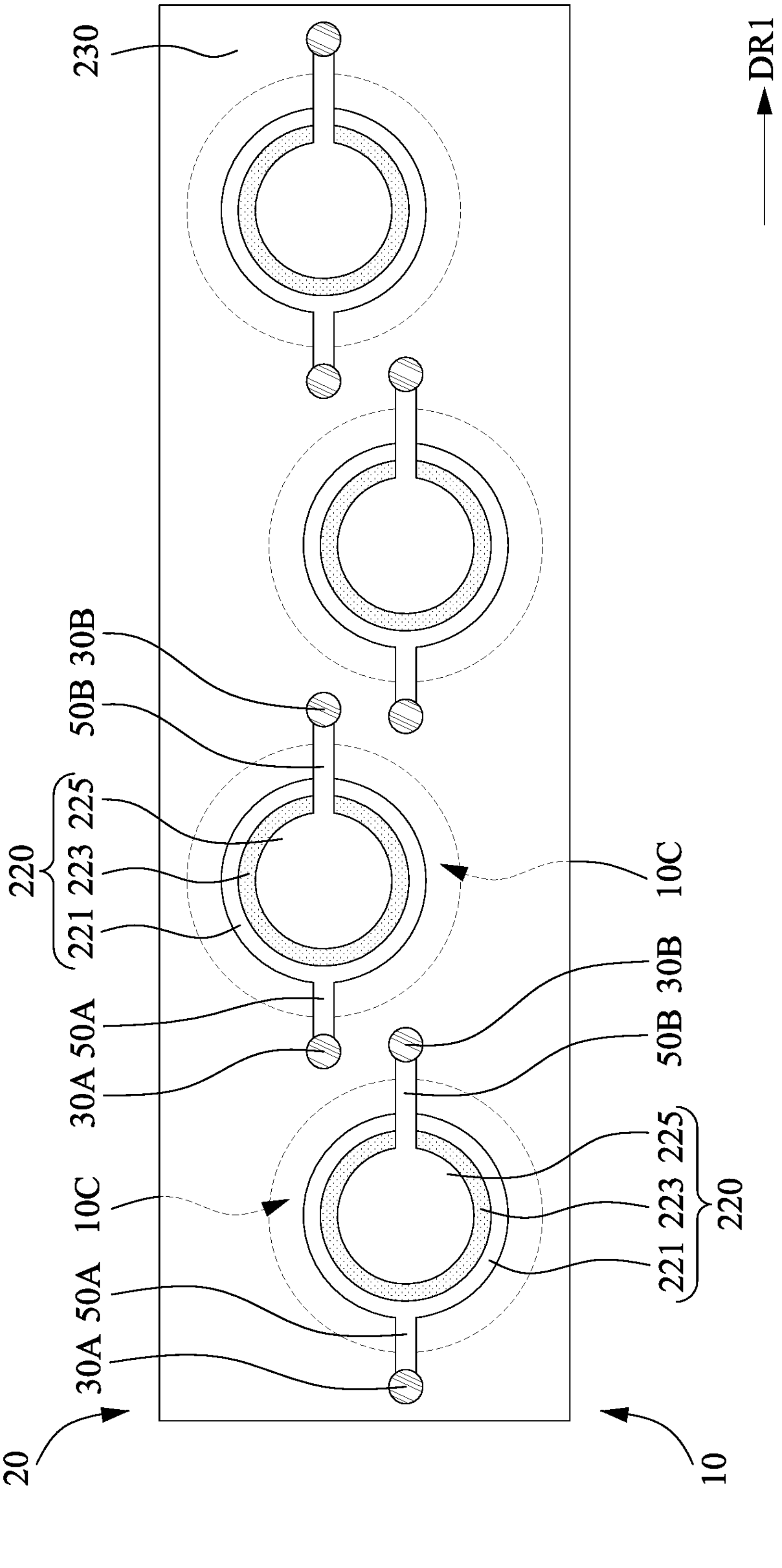
FIG. 5B is a top view of a semiconductor structure in accordance with some embodiments of the present disclosure.

FIG. 5B is a top view of a semiconductor structure 5B in accordance with some embodiments of the present disclosure. In some embodiments, the semiconductor structure 5B is similar to the semiconductor structure 2 in FIG. 2, with differences there between as follows. Descriptions of similar components are omitted.

In some embodiments, the conductive layers 50A and 50B extend in the direction DR1. In some embodiments, the semiconductor devices 220 are arranged in the direction DR1 in a staggered fashion. In some embodiments, the cavities 10C are arranged in the direction DR1 in a staggered fashion.

FIG. 6A, FIG. 6B, FIG. 6C, and FIG. 6D are top views of various semiconductor structures in accordance with some embodiments of the present disclosure. In some embodiments, each of FIG. 6A, FIG. 6B, FIG. 6C, and FIG. 6D shows an arrangement of one semiconductor device 220, one corresponding cavity 10C, and the conductive layers 50A and 50B and the IDVs 30A and 30B.

Figure 6B:
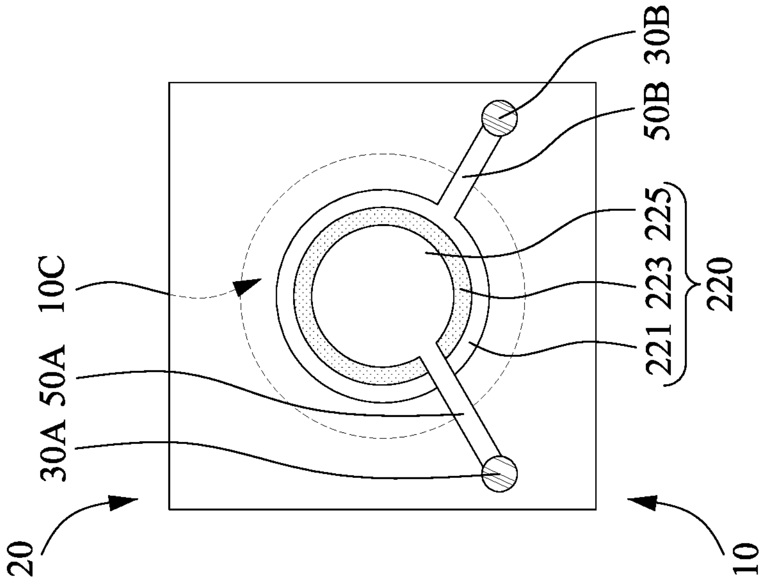
FIG. 6A, FIG. 6B, FIG. 6C, and FIG. 6D are top views of various semiconductor structures in accordance with some embodiments of the present disclosure.
Figure 6A:
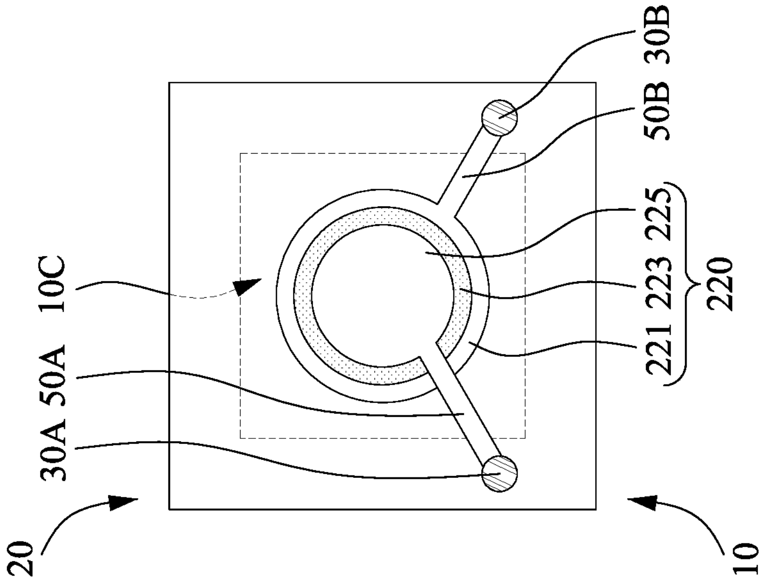

Referring to FIG. 6A, in some embodiments, the semiconductor device 220 has a circular shape, and the cavity 10C has a square shape. In some embodiments, the extending directions of the conductive layer 50A and the conductive layer 50B form an angle less than about 180°.

Referring to FIG. 6B, in some embodiments, the semiconductor device 220 and the cavity 10C both have a circular shape.

Figure 6D:
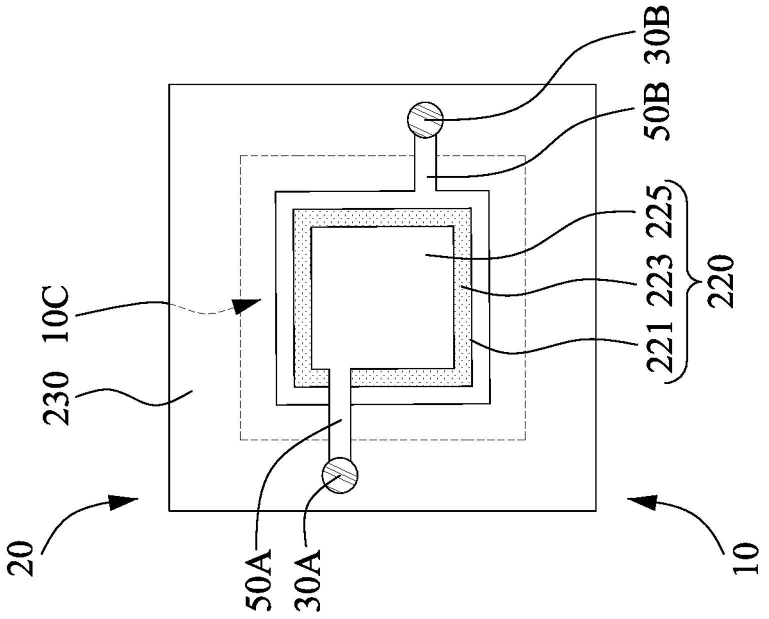
Figure 6C:
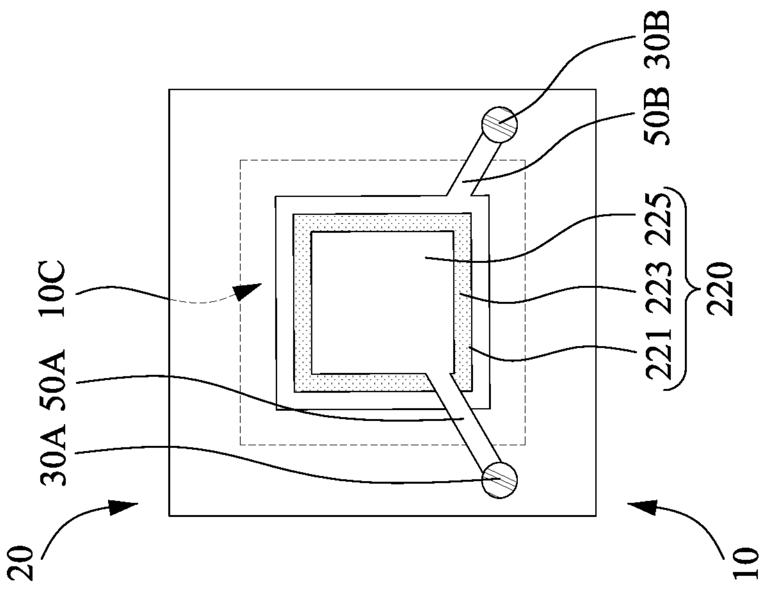

Referring to FIG. 6C, in some embodiments, the semiconductor device 220 and the cavity 10C both have a square shape.

Referring to FIG. 6D, in some embodiments, the conductive layer 50A and the conductive layer 50B are arranged in a staggered fashion.

FIGS. 7A to 7H are cross-sectional views of intermediate stages of a method of manufacturing a semiconductor structure in accordance with some embodiments of the present disclosure.

Figure 7A:
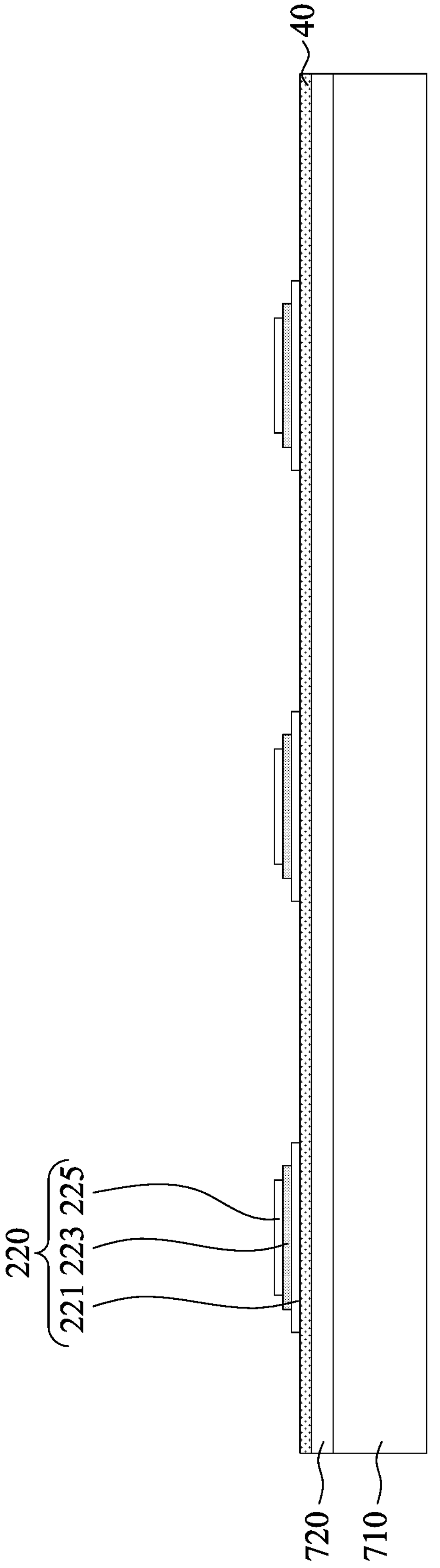
FIGS. 7A to 7H are cross-sectional views of intermediate stages of a method of manufacturing a semiconductor structure in accordance with some embodiments of the present disclosure.

Referring to FIG. 7A, a sacrificial layer 720 may be formed on a carrier 710, an insulating support layer 40 may be formed on the sacrificial layer 720, and one or more semiconductor devices 220 (or a ferroelectric memory) may be formed on the insulating support layer 40.

In some embodiments, the carrier 710 may be or include a silicon substrate. In some embodiments, the sacrificial layer 720 may include oxide, such as silicon dioxide. In some embodiments, the sacrificial layer 720 may be formed by deposition. In some embodiments, the insulating support layer 40 may include polysilicon (e.g., un-doped polysilicon).

In some embodiments, each of the semiconductor devices 220 is formed by forming an electrode 221 on the insulating support layer 40, forming a ferroelectric layer 223 on the electrode 221, and forming an electrode 225 on the ferroelectric layer 223. An electrode material may be formed (e.g., by deposition) on the insulating support layer 40, and then the electrode material may be patterned to form the electrodes 221. A ferroelectric material may be formed (e.g., by deposition) on the electrodes 221, and then the ferroelectric material may be patterned to form the ferroelectric layers 223 each on a corresponding electrode 221. An electrode material may be formed (e.g., by deposition) on the ferroelectric layers 223, and then the electrode material may be patterned to form the electrodes 225 each on a corresponding ferroelectric layer 223. As such, the semiconductor devices 220 are formed on the insulating support layer 40.

Figure 7B:
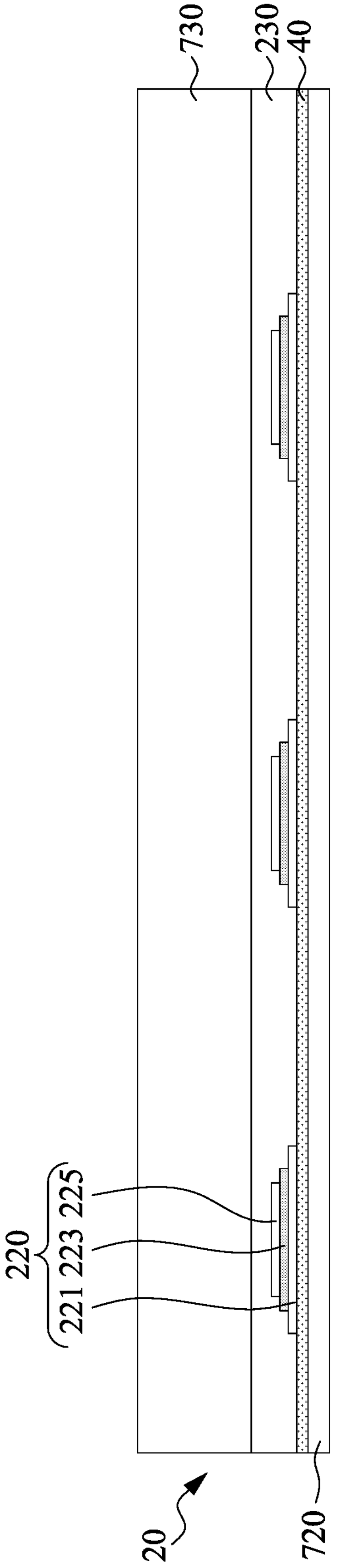

Referring to FIG. 7B, the carrier 710 may be removed by grinding to expose the sacrificial layer 720. In some embodiments, a dielectric structure 230 is formed on the semiconductor devices 220. The dielectric structure 230 may include oxide, such as silicon dioxide. The dielectric structure 230 may be formed by deposition. In some embodiments, a carrier 730 is bonded to the dielectric structure 230. In some embodiments, the carrier 710 is removed by grinding after the carrier 730 is bonded to the dielectric structure 230 serving as a support for the grinding operation. In some embodiments, the grinding operation may remove a portion of the sacrificial layer 720. As such, a wafer including die 20 and including the dielectric structure 230 and the semiconductor devices 220 formed therein is formed.

Figure 7C:
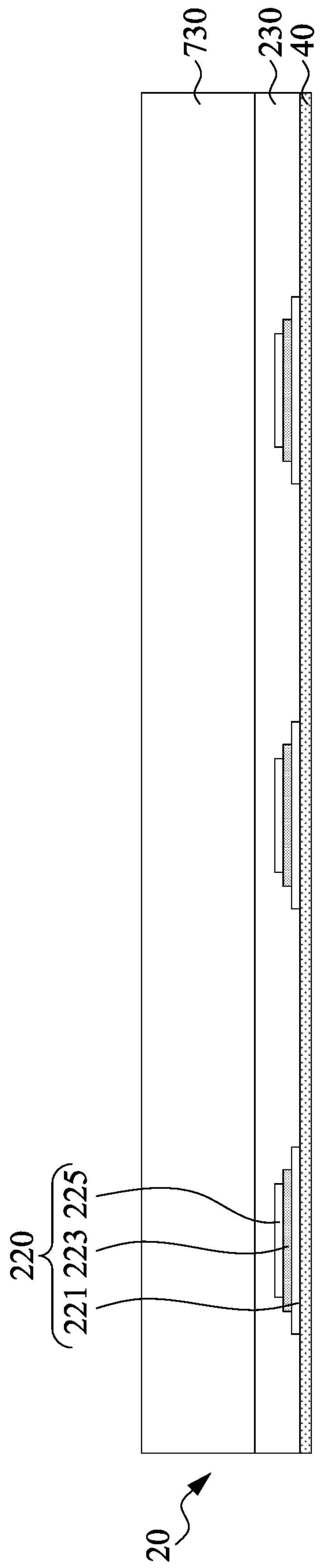

Referring to FIG. 7C, the sacrificial layer 720 may be removed by etching to expose the insulating support layer 40. In some embodiments, the sacrificial layer 720 is removed by a wet etching operation. In some embodiments, the sacrificial layer 720 is completely removed by the wet etching operation. While the wet etching operation has a relatively high etching selectivity between the sacrificial layer 720 and the insulating support layer 40, the sacrificial layer 720 can be completely removed without damaging the insulating support layer 40, and thus the insulating support layer 40 can be provided with a satisfactory predetermined thickness.

Figure 7D:
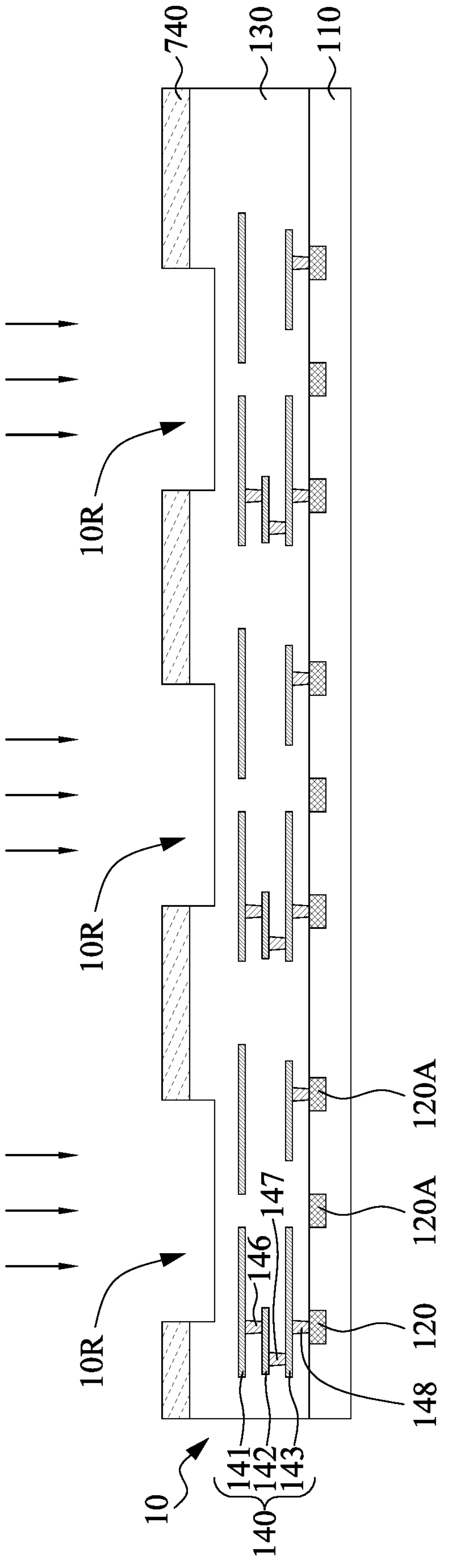

Referring to FIG. 7D, a wafer 10 including one or more CMOS devices 120 and 120A, a dielectric structure 130, and an interconnection structure 140 may be provided, and one or more recesses 10R may be formed in the wafer 10. In some embodiments, the recesses 10R are exposed from an upper surface 101 of the wafer 10.

In some embodiments, the recesses 10R may be formed by etching. In some embodiments, a patterned mask layer 740 having one or more openings may be disposed or formed on the upper surface 101 of the dielectric structure 130 of the wafer 10, and an etching operation may be performed on the dielectric structure 130 according to the patterned mask layer 740 to form the recesses 10R directly under the openings of the patterned mask layer 740. In some embodiments, the etching operation may be an isotropic etching operation (e.g., dry etch), and thus the as-formed recesses 10R have relatively straight sidewalls. In some other embodiments, the etching operation may be an anisotropic etching operation (e.g., wet etch), and then the as-formed recesses 10R may have curved sidewalls (referring to the curved side surfaces 10C3 of the cavity 10C illustrated in FIG. 1F).

Figure 7E:
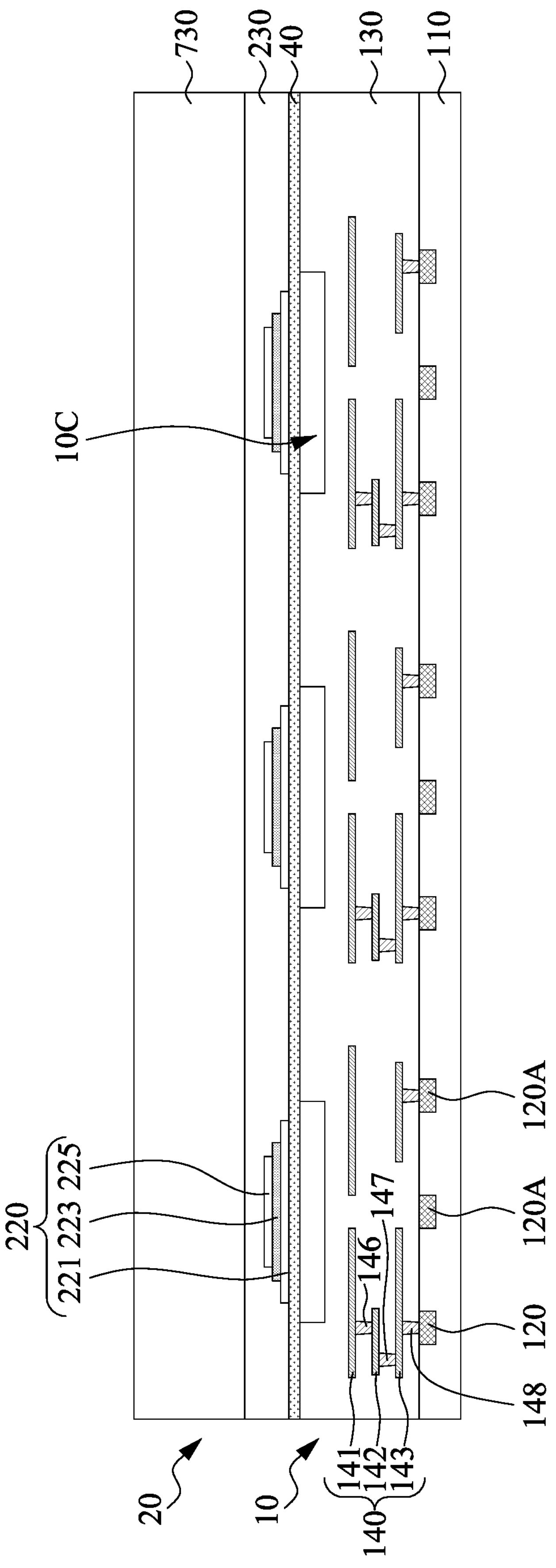

Referring to FIG. 7E, the wafer 20 may be bonded to the upper surface 101 of the wafer 10 to form one or more cavities 10C defined by the semiconductor devices 220 (or the ferroelectric memories) and the recesses 10R of the wafer 10. In some embodiments, the insulating support layer 40 is bonded to the upper surface 101 of the wafer 10. In some embodiments, each of the cavities is defined by the insulating support layer 40 and each of the recesses 10R of the wafer 10 after bonding the wafer 20 to the upper surface 101 of the wafer 10.

Figure 7F:
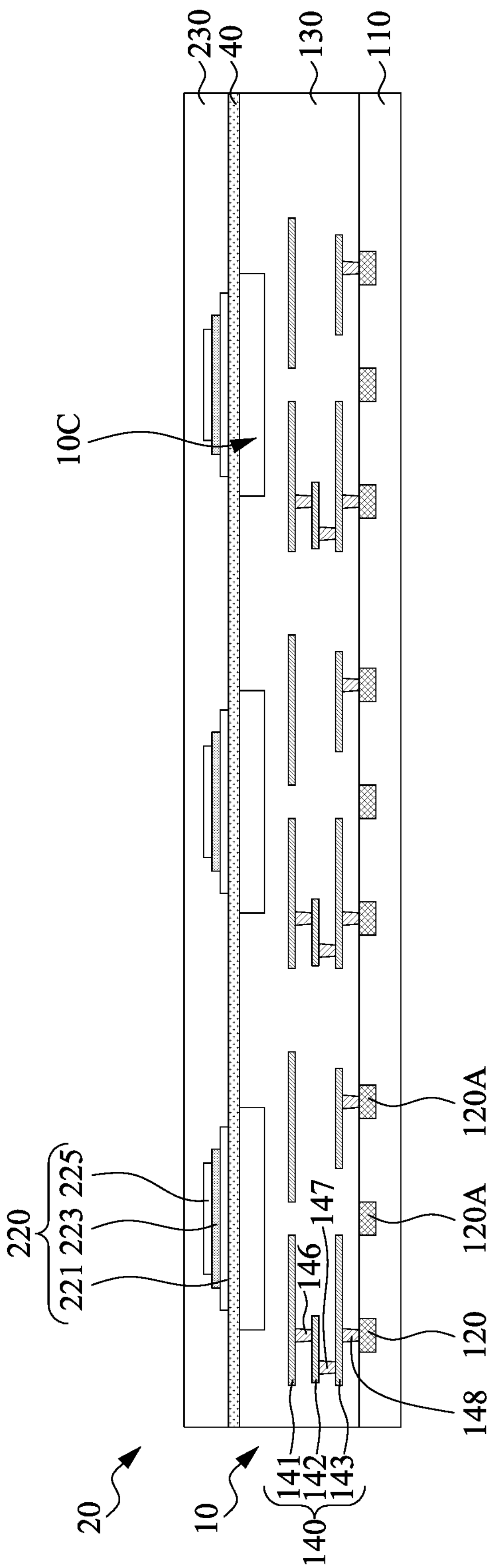

Referring to FIG. 7F, the carrier 730 may be removed. In some embodiments, the carrier 730 may be removed from the dielectric structure 230 by grinding or by heating.

Figure 7G:
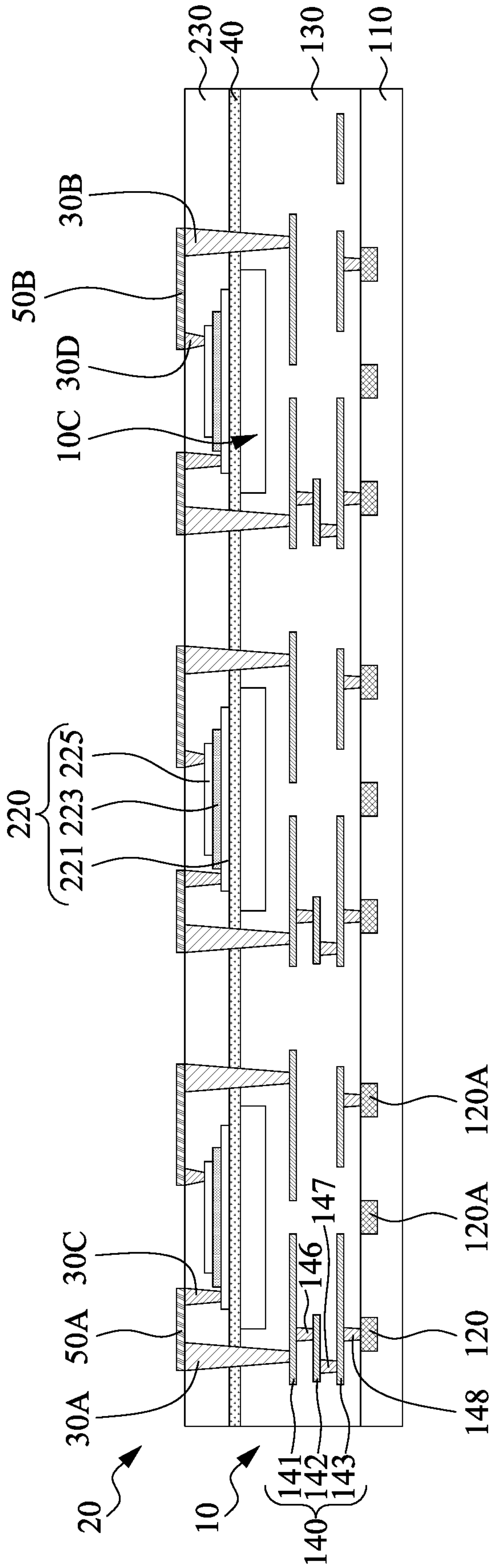

Referring to FIG. 7G, IDVs 30A and 30B may be formed penetrating the wafers 10 and 20, vias 30C and 30D may be formed within the dielectric structure 230, and conductive layers 50A and 50B may be formed on the dielectric structure 230. In some embodiments, a plurality of inter via openings are formed, e.g., by etching, within and penetrating the wafers 10 and 20, and a conductive material is formed in the inter via openings, e.g., by sputtering. In some embodiments, a CMP operation may be performed to remove excess conductive material outside of the inter via openings. In some embodiments, a conductive material is formed on the dielectric structure 230 and contacting the IDVs 30A and 30B, and vias 30C and 30D, e.g., by sputtering. In some embodiments, the conductive material is then patterned to form the conductive layers 50A and 50B.

Figure 7H:
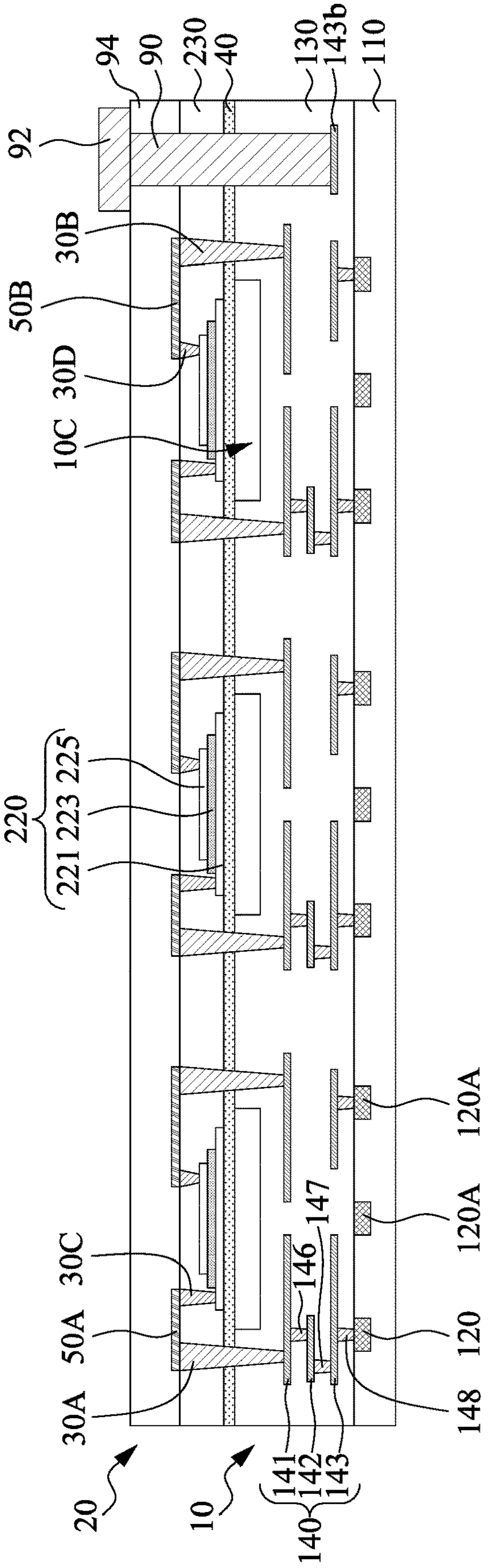

Referring to FIG. 7H, a dielectric structure 94 (also referred to as "a passivation layer") may be formed on the dielectric structure 230, an inter via opening may be formed penetrating the dielectric structure 94 and the wafers 10 and 20 to stop at a conductive layer 134*b* of the interconnection structure 140. In some embodiments, a conductive material is formed in the inter via opening to form a IDV 90, and a conductive layer 92 is formed on the dielectric structure 94 and electrically connected to the IDV 90. In some embodiments, and IDV 90 and the conductive layer 92 may serve to electrically connect the CMOS devices 120 and/or 120A to an external circuit. The external circuit may be configured to control the CMOS devices 120 and/or 120A. As such, a semiconductor structure 7 illustrated in FIG. 7H is formed.

FIGS. 8A to 8F are cross-sectional views of intermediate stages of a method of manufacturing a semiconductor structure in accordance with some embodiments of the present disclosure.

Figure 8A:
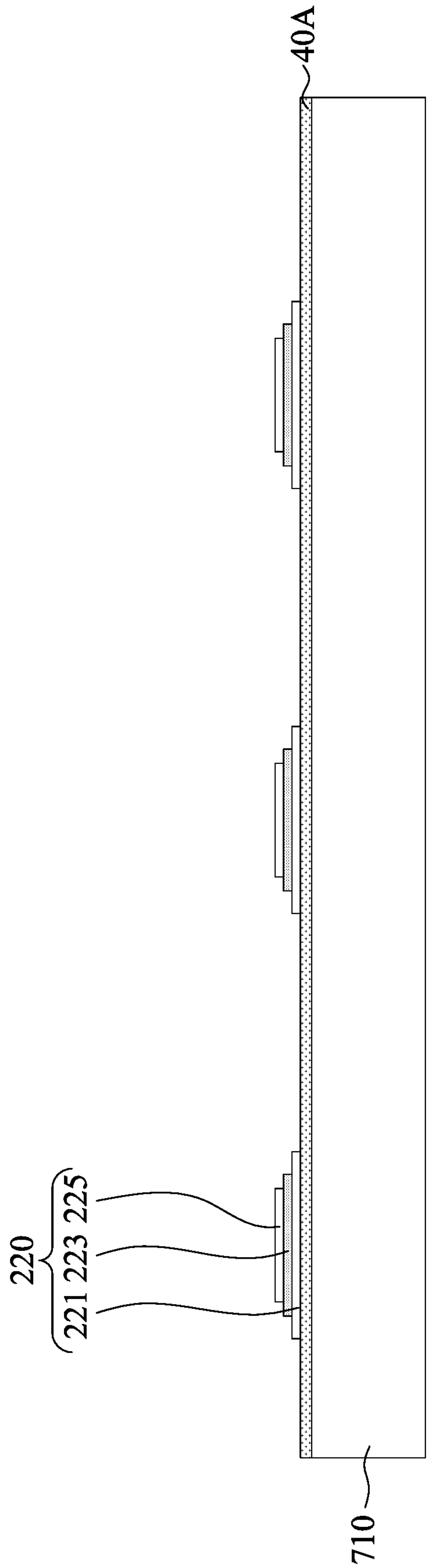
FIGS. 8A to 8F are cross-sectional views of intermediate stages of a method of manufacturing a semiconductor structure in accordance with some embodiments of the present disclosure.

Referring to FIG. 8A, an insulating support layer 40A may be formed on a carrier 710, and one or more semiconductor devices 220 (or a ferroelectric memory) may be formed on the insulating support layer 40A. In some embodiments, the carrier 710 may be or include a silicon substrate. In some embodiments, the insulating support layer 40A may include oxide, such as silicon dioxide.

Figure 8B:
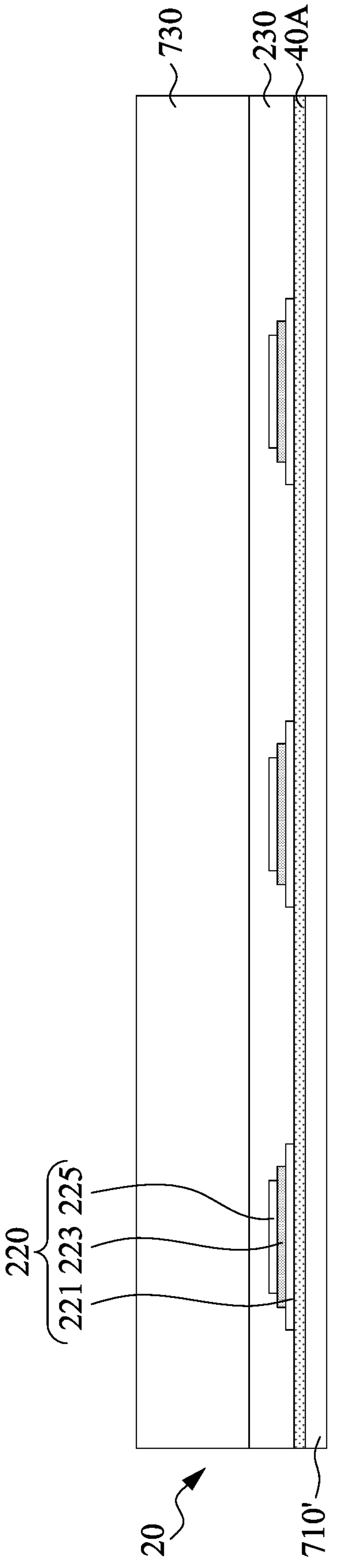

Referring to FIG. 8B, the carrier 710 may be partially removed by grinding, and the remained carrier 710' has a reduced thickness.

Figure 8C:
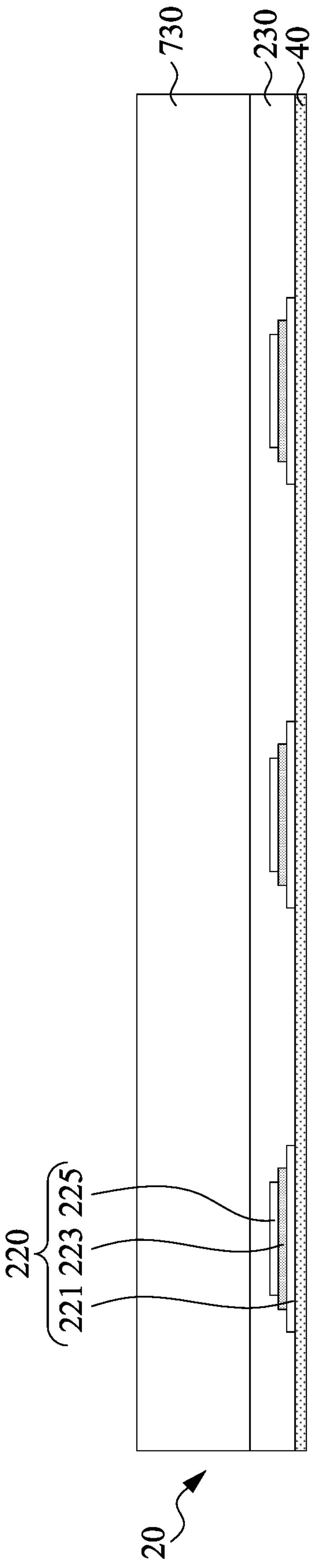

Referring to FIG. 8C, the carrier 710' may be removed by chemical mechanical polishing (CMP) to expose the as-formed insulating support layer 40. In some embodiments, the carrier 710' is completely removed by CMP. In some embodiments, the CMP operation may remove a portion of the insulating support layer 40A to form the insulating support layer 40 having a reduced thickness.

Figure 8D:
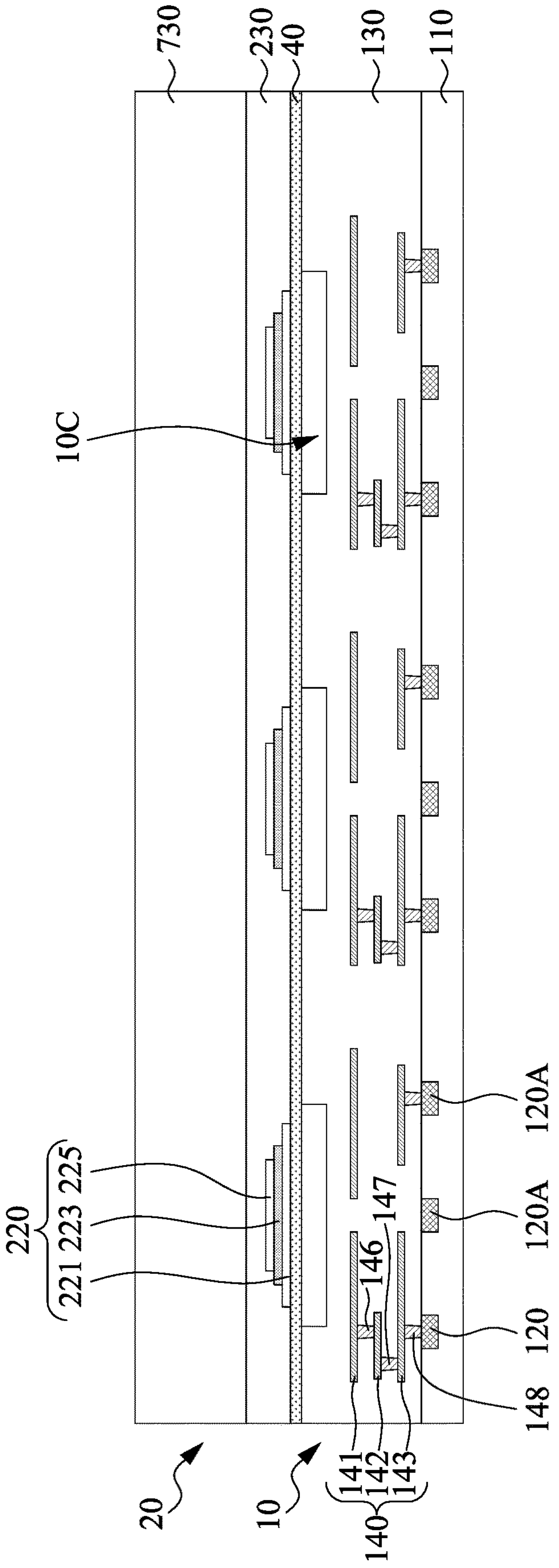

Referring to FIG. 8D, operations similar to those illustrated in FIGS. 7D-7E may be performed to bond the wafer 10 to the wafer 20, and one or more cavities 10C may be formed.

Figure 8E:
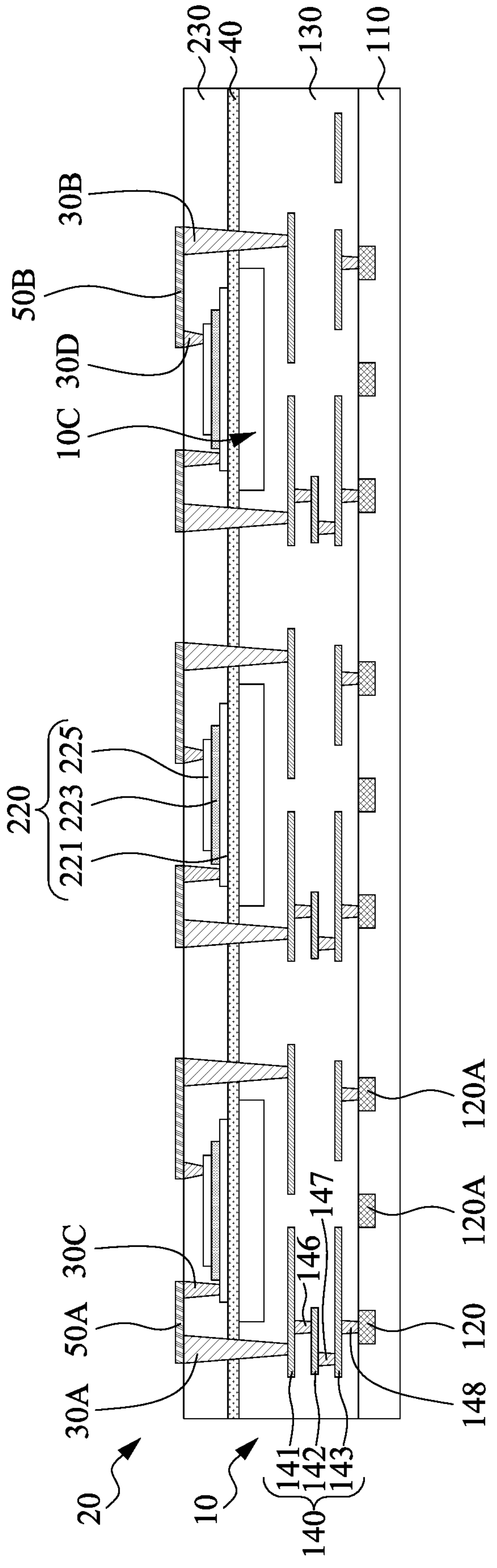

Referring to FIG. 8E, operations similar to those illustrated in FIGS. 7F-7G may be performed to remove the carrier 730 and form the IDVs 30A and 30B, and vias 30C and 30D and the conductive layers 50A and 50B.

Figure 8F:
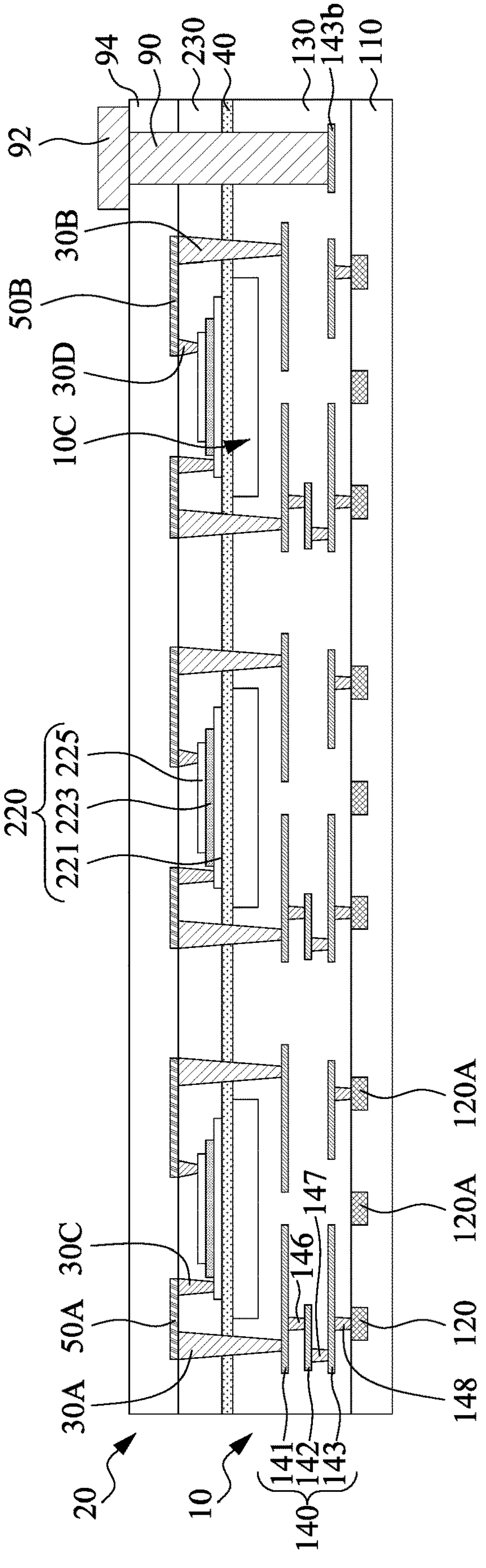

Referring to FIG. 8F, operations similar to those illustrated in FIG. 7H may be performed to form a IDV 90, a conductive layer 92, and a dielectric structure 94. As such, a semiconductor structure 8 illustrated in FIG. 8 is formed.

According to an embodiment, a semiconductor structure includes a first die, a second die, and an inter die via (IDV). The first die includes an interconnection structure and a CMOS device electrically connected to the interconnection structure. The second die includes a memory element including a first electrode, a ferroelectric layer on the first electrode, and a second electrode on the ferroelectric layer, wherein a peripheral region of the ferroelectric layer is exposed by and surrounding the second electrode from a top view perspective. The IDV electrically connects the interconnection structure of the first die to the memory element of the second die.

According to an embodiment, a semiconductor structure includes a semiconductor wafer and a semiconductor device. The semiconductor wafer includes a dielectric structure having a cavity exposed from an upper surface of the semiconductor die and an interconnection structure below the cavity. The semiconductor device is stacked on the semiconductor die and includes a first conductive layer, a ferroelectric layer on the first conductive layer, and a second conductive layer on the ferroelectric layer, wherein a peripheral region of the ferroelectric layer is exposed by and surrounding the second conductive layer from a top view perspective, and the ferroelectric layer is over the cavity of the semiconductor wafer.

According to an embodiment, a method of manufacturing a semiconductor structure includes: providing a first wafer comprising a CMOS device; providing a second wafer comprising a ferroelectric memory, wherein the ferroelectric memory comprises a first electrode, a ferroelectric layer on the first electrode, and a second electrode on the ferroelectric layer, wherein a peripheral region of the ferroelectric layer is exposed by and surrounding the second electrode from a top view perspective; forming a recess in the first wafer, the recess being exposed from an upper surface of the first wafer; and bonding the second wafer to the upper surface of the first wafer to form a cavity defined by the ferroelectric memory and the recess of the first wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a first die comprising an interconnection structure and a CMOS device electrically connected to the interconnection structure;

a second die comprising a memory element comprising a first electrode, a ferroelectric layer on the first electrode, and a second electrode on the ferroelectric layer, wherein a peripheral region of the ferroelectric layer is exposed by and surrounds the second electrode from a top view perspective, wherein the first die has a cavity over the interconnection structure and underneath the ferroelectric layer;

an inter-die via (IDV) electrically connecting the interconnection structure of the first die to the memory element of the second die; and an insulating support layer between the ferroelectric layer and the cavity, wherein the IDV penetrates the first die and the insulating support layer to electrically connect to the second die;

and wherein the ferroelectric layer has a curvature, and the curvature carries at least partially through to an upper surface of the cavity nearest the ferroelectric layer.

2. The semiconductor structure according to claim 1, wherein the cavity is directly underneath the ferroelectric layer.

3. The semiconductor structure according to claim 1, wherein a projection of the ferroelectric layer is entirely within a projection of the cavity from a top view perspective.

4. The semiconductor structure according to claim 1, wherein the first die comprises a plurality of cavities exposed from an upper surface of the first die, the second die comprises a plurality of memory elements including the memory element, and the ferroelectric layer of each of the memory elements is directly above each of the cavities.

5. The semiconductor structure according to claim 1, wherein the IDV penetrates the first die and the second die to electrically connect the CMOS device to the first electrode or the second electrode of the memory element.

6. A semiconductor structure, comprising:

a semiconductor die comprising a dielectric structure having a cavity exposed from an upper surface of the semiconductor die and an interconnection structure below the cavity; and a semiconductor device stacked on the semiconductor die, the semiconductor device comprising a first conductive layer, a ferroelectric layer on the first conductive layer, and a second conductive layer on the ferroelectric layer, wherein a peripheral region of the ferroelectric layer is exposed by and surrounds the second conductive layer from a top view perspective, and the ferroelectric layer is directly over the cavity of the semiconductor die; and an insulating support layer between the ferroelectric layer and the cavity, wherein the cavity is an enclosed space defined by the dielectric structure and the insulating support layer, wherein the semiconductor device is entirely within a projection of the cavity from a top view perspective, and wherein a portion of a bottom surface of the insulating support layer defines a curved upper surface of the cavity.

7. The semiconductor structure according to claim 6, wherein the cavity is filled with air or an inert gas.

8. The semiconductor structure according to claim 6, further comprising an IDV penetrating the semiconductor die and the insulating support layer to electrically connect the interconnection structure of the semiconductor die to the semiconductor device.

9. The semiconductor structure according to claim 8, wherein the IDV extends along and is spaced apart from a side of the cavity.

10. The semiconductor structure according to claim 6, further comprising a plurality of semiconductor devices including the semiconductor device stacked on the semiconductor die, the dielectric structure has a plurality of cavities, and the ferroelectric layer of each of the semiconductor devices is directly above each of the cavities.

11. A semiconductor structure, comprising:

a first die comprising a CMOS device, and an interconnection structure over the first die;

a second substrate comprising a ferroelectric memory, wherein the ferroelectric memory comprises a first electrode, a ferroelectric layer on the first electrode, and a second electrode on the ferroelectric layer, wherein a peripheral region of the ferroelectric layer is exposed by and surrounds the second electrode from a top view perspective;

a recess disposed in the first die, the recess being exposed at an upper surface of the first die; and wherein the second substrate is bonded to the upper surface of the first die to form a cavity defined by the recess and arranged between the first die and the second substrate; and an inter-die via (IDV) extending from a height over the ferroelectric memory and downward past a sidewall of the ferroelectric memory to make electrical contact with the interconnection structure of the first die and thereby couple the ferroelectric memory to the interconnection structure of the first die.

12. The semiconductor structure according to claim 11, further comprising:

an insulating support layer arranged between a first substrate of the first die and the second substrate, wherein the cavity is defined by a lower surface of the insulating support layer and the recess of the first substrate.

13. The semiconductor structure according to claim 12, wherein the insulating support layer contacts the upper surface of the first substrate.

14. The semiconductor structure according to claim 11, wherein the cavity has vertical sidewalls from a cross-sectional view perspective.

15. The semiconductor structure according to claim 11, wherein the cavity has curved sidewalls from a cross-sectional view perspective.

16. The semiconductor structure according to claim 1, where the cavity has a depth in a range of about 0.1 μm to about 100 μm.

17. The semiconductor structure according to claim 1, where the cavity has a width in a range of about 5 μm to about 100 μm.

18. The semiconductor structure of claim 11, wherein the ferroelectric layer has a curvature, and the curvature carries at least partially through to an upper surface of the cavity nearest the ferroelectric layer.

19. The semiconductor structure according to claim 6, where the cavity has a depth in a range of about 0.1 μm to about 100 μm.

20. The semiconductor structure according to claim 11, where the cavity has a depth in a range of about 0.1 μm to about 100 μm.

* * * * *